(12) United States Patent
Ciubotaru

(10) Patent No.: US 9,614,434 B2
(45) Date of Patent: Apr. 4, 2017

(54) CHARGE PUMP CIRCUIT WITH ENHANCED OUTPUT IMPEDANCE

(71) Applicant: Analog Devices, Inc., Norwood, MA (US)

(72) Inventor: Alexandru A. Ciubotaru, Somerset, NJ (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 14/802,530

(22) Filed: Jul. 17, 2015

(65) Prior Publication Data
US 2017/0019021 A1 Jan. 19, 2017

(51) Int. Cl.
H03L 7/06 (2006.01)
H02M 3/07 (2006.01)
H03L 7/089 (2006.01)

(52) U.S. Cl.
CPC .............. *H02M 3/07* (2013.01); *H03L 7/089* (2013.01)

(58) Field of Classification Search
CPC ....................................................... H02M 3/07
See application file for complete search history.

(56) References Cited

U.S. PATENT DOCUMENTS

| 5,369,376 A | 11/1994 | Leblebicioglu |
| 6,124,741 A | 9/2000 | Arcus |
| 7,702,059 B2 | 4/2010 | Miller et al. |
| 7,777,541 B1 * | 8/2010 | Stansell ................ H03L 7/0891 327/148 |

OTHER PUBLICATIONS

"CMOS, Low Voltage RF/Video, SPDT Switch", Analog Devices—ADG752, (2013), 1-9.
Boerstler, David W., "A Low-Jitter PLL Clock Generator for Microprocessors with Lock Range of 340-612 MHz", IEEE Journal of Solid-State Circuits, vol. 34, No. 4, (Apr. 1999), 513-519.
Chen, Run, et al., "A 0.5-to-3 GHz Software-Defined Radio Receiver Using Discrete-Time RF Signal Processing", IEEE Journal of Solid-State Circuits, vol. 49, No. 5, (May 2014), 1097-1111.

(Continued)

*Primary Examiner* — Daniel Puentes
(74) *Attorney, Agent, or Firm* — Schwegman Lundberg & Woessner, P.A.

(57) ABSTRACT

A programmable charge pump, such as for use in CMOS phase-locked loop circuits, is provided. In an example, the charge pump includes a reference stage that provides DC signals to an output stage of the charge pump. The output stage includes output switches for generating output pulses in accordance with external control signals. In an example, loop performance can be improved when an output stage of the charge pump provides a relatively large output impedance. The output switches can be isolated when the charge pump is in an OFF state. For example, respective isolation switches can be used to substantially concurrently switch source and drain terminals for each of the output switches in the charge pump. In an example, a reference stage of the charge pump can provide a buffer for reducing charge-sharing between the output switches and an output node of the output stage.

20 Claims, 38 Drawing Sheets

(56) References Cited

OTHER PUBLICATIONS

Gonzalez, Mauricio Pardo, "MEMS-based Phase-Locked-Loop Clock Conditioner", In Partial Fulfillment of the requirements for the degree Doctor of Philosophy in Electrical and Computer Engineering—Georgia Institute of Technology, (May 2012), 181 pgs.

Lee, Jae-Shin, et al., "Charge pump with perfect current matching characteristics in phase-locked loops", Electronics Letters, vol. 36, Nov. 23, (Nov. 9, 2000), 1907-1908.

Pardo, Mauricio, et al., "A Band-Reject Nested-PLL Clock Cleaner Using a Tuable MEMS Oscillator", IEEE Transactions on Circuits and Systems—I: Regular Papers, vol. 61, No. 3, (Mar. 2014), 653-662.

Rhee, Woogeun, "Design of High-Performance CMOS Charge Pumps in Phase-Locked Loops", IEEE, (1999), 11-545 to 11-548.

Tsitouras, Athanasios, et al., "A 1 V CMOS programmable accurate charge pump with wide output voltage range", Microelectronics Journal 42, (2011), 1082-1089.

Yang, Howard C., et al., "A Low Jitter 0.3-165 MHz CMOS PLL Frequency Synthesizer for 3 V/5 V Operation", IEEE Journal of Solid-State Circuits, vol. 32, No. 4, (Apr. 1997), 582-586.

\* cited by examiner

CHARGE PUMP CIRCUIT WITH ENHANCED OUTPUT IMPEDANCE

BACKGROUND

Digital and analog electronic systems can rely on or use clocks to synchronize operations such as data transfers. In an example, a clock signal can be generated using an oscillator in a phase locked loop (PLL) circuit. A PLL circuit can include, among other things, a phase detector, a charge pump circuit, a loop filter, and a voltage-controlled oscillator (VCO). The phase detector can compare reference phase or frequency information from a reference clock with a feedback clock signal from the PLL circuit's VCO. Based on the comparison, the phase detector can provide an output signal that includes information about a mismatch between the phase or frequency of the feedback clock signal and the reference. The charge pump circuit can receive the output signal from the phase detector and, in response, can cause charge to be added to or removed from the loop filter. As the charge pump circuit changes the charge at the filter, the output phase or frequency of the VCO is changed.

A charge pump circuit can be programmable to provide a range of output levels for the VCO and the PLL. In an example, a charge pump circuit includes multiple stages, or legs, and each of the stages can be selectively operated to provide the charge pump's output. Some parameters of the charge pump circuit can be negatively affected by the programmable nature of the circuit, such as due to the various circuit features used to enable the programmability. One such parameter that can be negatively affected is an output impedance of the charge pump circuit. In an example, an output impedance of a charge pump circuit is low at low gain settings, such as due to parasitic effects of high-current-handling devices in the charge pump circuit. Such reduced or low output impedance can affect the loop filter, and can limit a flexibility or breadth of the PLL circuit's transfer function.

OVERVIEW

The present inventor has recognized, among other things, that a problem to be solved includes enhancing or increasing an output impedance characteristic of a charge pump circuit while including, in the charge pump circuit, switch or transistor devices that can accommodate large charge pump current signals. In an example, the problem includes minimizing or removing a parasitic effect, such as a parasitic capacitance or parasitic resistance, that can be inherent to the use of a transistor such as a MOSFET transistor in a pullup or pulldown portion of a charge pump circuit output stage.

In an example, a solution to the above-described problem includes a programmable charge pump circuit having an output stage with enhanced output impedance characteristics. The output stage can include different pullup and pulldown switches, or transistors, that can selectively sink or supply current to an output node. The output impedance at the output node of the charge pump circuit can be enhanced by using substantially concurrent or simultaneous source and drain switching for each of the pullup or pulldown switches in the output stage of the charge pump circuit. In an example, the substantially concurrent or simultaneous switching can help to maintain matched currents through the respective portions of the output stage that include the pullup and pulldown switches.

In an example, the charge pump circuit includes a bias section, and a portion of the bias section includes a topology that mimics a portion of the output stage. The bias section can provide one or more DC bias voltage signals to the pullup or pulldown switches. In an example, the bias section uses negative feedback information from the output node of the charge pump circuit for providing one or more of the bias voltage signals. In an example, a bias voltage signal, such as based on negative feedback information from the output node of the output section of the charge pump circuit, can help to improve current matching in the pullup and pulldown switch portions in each of one or more output stages of the charge pump circuit. In an example, the bias section acts as a buffer for reducing charge sharing between the output node and the pullup and pulldown switches.

In an example, the present subject matter includes a high-speed, programmable, integrated, single-ended charge pump circuit for use in a phase-locked loop circuit. The charge pump circuit can include a reference section that is configured to provide DC levels to an output section of the charge pump circuit. The output section can include switching devices, such as pullup and pulldown switches, for sinking or supply output current pulses, based on external control signals, at an output node of the charge pump circuit. In an example, a large output impedance can be provided at the output node of the charge pump circuit. When the charge pump circuit has a large output impedance, a loop filter circuit that follows the charge pump circuit, such as in a PLL system, can have fewer constraints (i.e., fewer components) and can contribute to better, more flexible loop performance. Ensuring a high output impedance of the charge pump circuit while providing large output current pulses from the charge pump circuit can be a design challenge, for example, because devices in the output section can be specified to be physically large to accommodate large currents. Such large-current devices generally exhibit low impedance characteristics even when in an OFF state, thereby degrading an output impedance characteristic of the charge pump circuit. In an example, one or more of a charge pump circuit's output pullup and/or pulldown switches can be isolated from the circuit's output to enhance an output impedance characteristic of the circuit when the switches are in an OFF state. In an example, the output pullup and/or pulldown switches can be isolated using substantially concurrent or simultaneous source and drain switching at each of the switches.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

This detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. The present inventors contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein."

Figure 1:
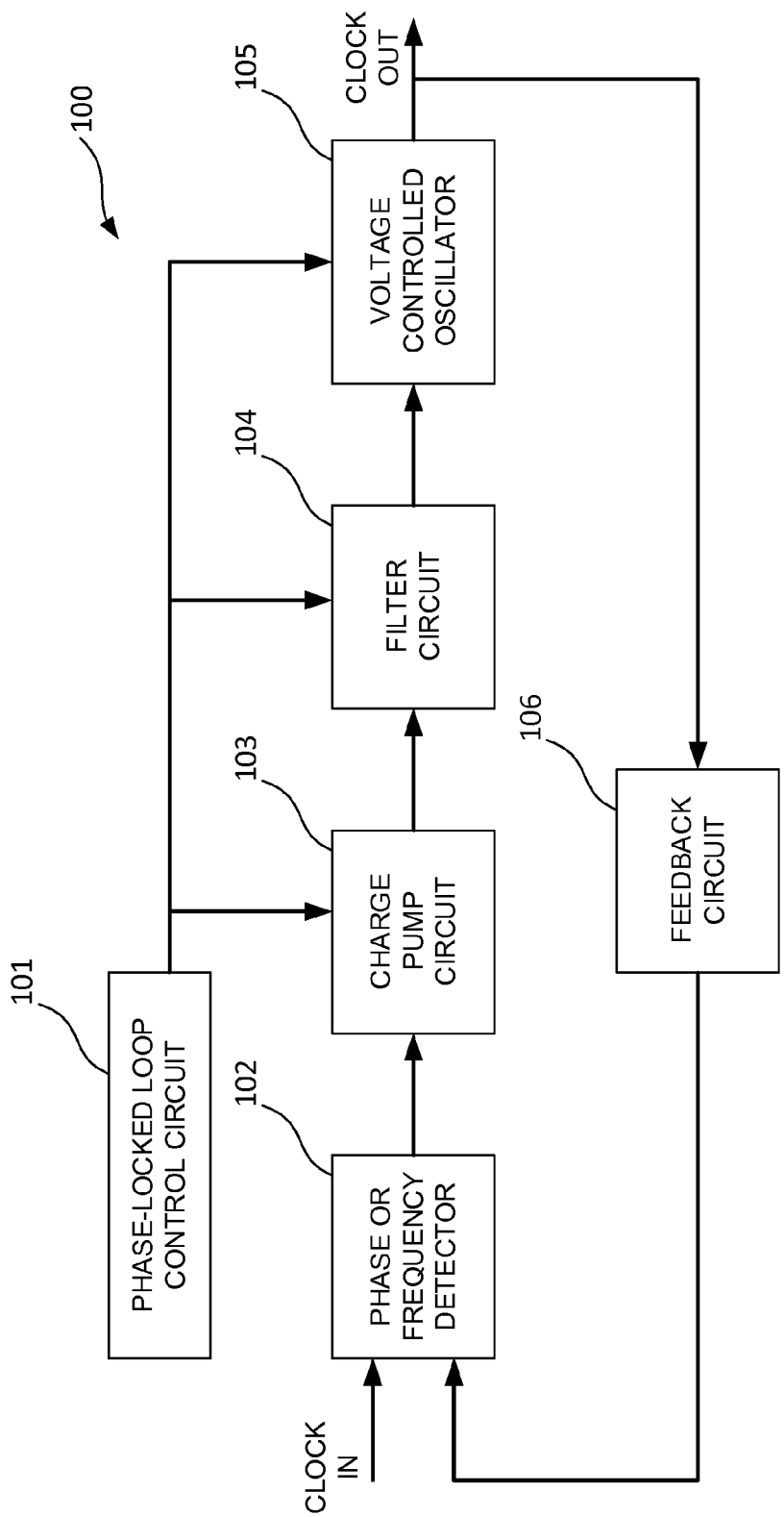
FIG. 1 illustrates generally an example of phase-locked loop circuit.

Systems and methods described herein can generally be applied in charge pump circuits, such as in the context of a phase-locked loop circuit. FIG. 1 illustrates generally an example that includes multiple functional blocks that represent portions of a phase-locked loop circuit 100 (PLL 100). In the example of FIG. 1, the PLL 100 includes a phase-locked loop control circuit 101, a phase or frequency detector circuit 102, a charge pump circuit 103, a filter circuit 104, a voltage-controlled oscillator circuit 105 (VCO 105), and a feedback circuit 106. The phase or frequency detector circuit 102 receives both a CLOCK IN signal, such as from a reference clock signal generator, and a feedback signal from the feedback circuit 106. The output of the PLL 100 is a CLOCK OUT signal.

In the example of FIG. 1, the phase or frequency detector circuit 102 compares the CLOCK IN signal with a phase or frequency of a feedback clock signal, such as provided by the feedback circuit 106 and based on the CLOCK OUT signal at the output of the VCO 105. In an example, the feedback circuit 106 is configured to divide the CLOCK OUT signal generated by the VCO 105 and provided the resulting signal to the phase or frequency detector circuit 102.

The phase or frequency detector circuit 102 can output signals, such as UP or DOWN signals, when a phase or frequency of the CLOCK IN signal does not match the phase or frequency of the other input signal. The UP or DOWN signals can be received by the charge pump circuit 103, and in response the charge pump circuit 103 charges or discharges a current storage element of the filter circuit 104. In response to changes in charge at the filter circuit 104, the VCO 105 is caused to increase or decrease the frequency of the CLOCK OUT signal. In an example, in response to changes in CLOCK OUT, the phase and frequency of the feedback signal from the feedback circuit 106 are adjusted until the feedback signal matches the reference signal, CLOCK IN. When the signals are substantially matched, the phase or frequency detector circuit 102 can cease generating the UP or DOWN signals, such as until charge leaks from the filter circuit 104 or until the reference signal CLOCK IN changes. In an example, short-duration UP and DOWN signals are both provided, such as substantially simultaneously, by the phase or frequency detector circuit 102 when no adjustment of CLOCK OUT is needed. In response, the charge pump circuit 103 supplies a net zero charge to the filter circuit 104.

In an example, the charge pump circuit 103 is a programmable charge pump circuit that includes multiple stages or legs that can be selectively used to supply current to, or sink current from the filter circuit 104. Each of the stages can include respective pairs of pullup and pulldown switches, such as can be implemented using MOSFET or other devices. In an example, a technique for increasing an output impedance of a programmable charge pump circuit stage includes balancing a pullup or pulldown switch size in an attempt to satisfy the conflicting requirements of large device size, such as for handling relatively large current signals in an ON state, and of small device size, such as for minimizing parasitic effects inherent to a transistor in an OFF state. In this example, if any one or more of the multiple stages or legs in the charge pump circuit are unused, then the unused stages can each contribute to a loading effect for the filter circuit 104, such as due to parasitic effects of one or more switches or other elements in the respective stages. To help increase the output impedance of the charge pump circuit 103, and as further described herein, the pullup and/or pulldown switches in each of the charge pump circuit's stages can be selectively isolated.

In an example, a current signal in an output stage of a programmable charge pump circuit can be switched using a MOS transistor, such as by switching a drain, gate, or source terminal of the transistor. When the transistor is switched at only one terminal, an output impedance of the charge pump can be reduced because of parasitic or other effects associated with the transistor itself. And when several stages are used together, and each stage includes at least one unused or OFF transistor, the effect on the output impedance of the charge pump circuit can be problematic. In an example, an output switch can be used in addition to a source terminal switch for a transistor in each stage of a charge pump circuit. Although the output switch can increase isolation (and therefore output impedance) when the charge pump circuit is not delivering current, such a configuration can exhibit up/down current mismatch issues because of a voltage developed across one or more of the output switches when the charge pump circuit delivers current. Techniques for minimizing such a mismatch are further described herein.

In an example, a programmable charge pump circuit with improved output impedance characteristics includes multiple pump stages, and each of the pump stages includes both of a pullup field-effect transistor (FET) and a pulldown FET, and each of the FETs is coupled to a shared charge pump output node. A method for enhancing an output impedance of the programmable charge pump can include identifying, for isolation from the output node of the charge pump circuit, a first unused pump stage from the multiple pump stages in the charge pump circuit. In the identified first unused pump stage, the method can include using a first switch to decouple a source node of a first pullup FET from a supply rail of the first unused pump stage. The method can include using a second switch to decouple a drain node of the first pullup FET from the charge pump output node. The method can include using a third switch to decouple a source node of a first pulldown FET from a reference node of the first unused pump stage. The method can further include using a fourth switch to decouple a drain node of the first pulldown FET from the charge pump output node.

In an example, the programmable charge pump can be used to provide a control signal to a VCO, such as in a PLL circuit. Operating the PLL circuit can include detecting a difference between a reference clock signal and a feedback signal based on an oscillating output voltage of the PLL circuit, and then generating a digital signal based on the detected difference between the reference clock signal and the feedback signal. This example can include selecting for use at least one pump stage of the charge pump circuit, and the selected pump stage includes a first pullup field-effect transistor (FET) and a first pulldown FET coupled at an output node of the charge pump circuit. In this example, in response to the signal generated based on the detected difference between the reference clock signal and the feedback signal, at least one of the first pullup FET and the first pulldown FET can be selectively decoupled from the pump stage using separate switches that are respectively associated with a drain and a source of the first pullup FET or the first pulldown FET.

Figure 2:
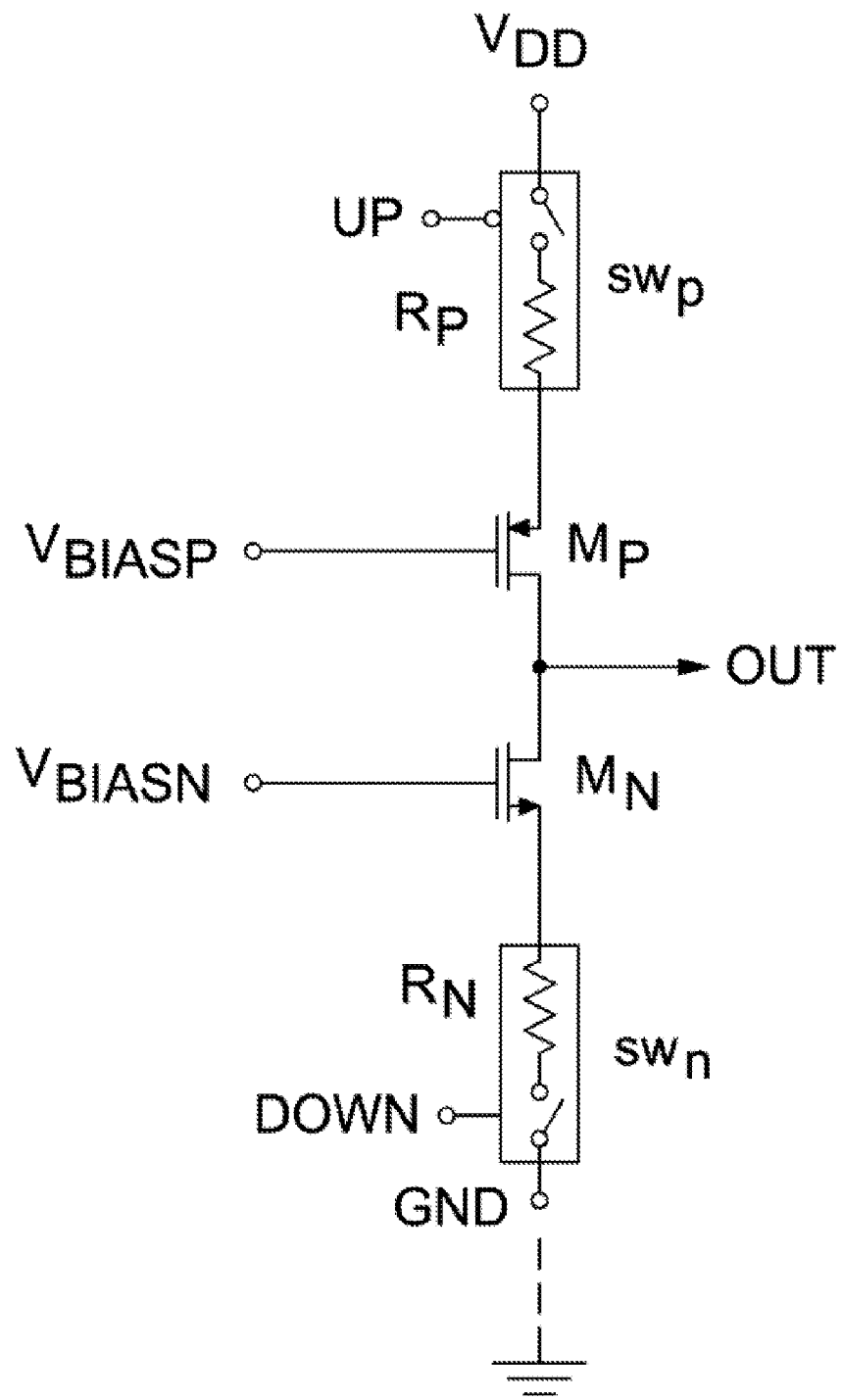
FIG. 2 illustrates generally an example of a charge pump output stage using ideal switches.

Referring now to FIG. 2, an example of a charge pump circuit output stage is illustrated. In the example of FIG. 2, ideal switches $sw_n$ and $sw_p$ are provided at the sources of output switch devices $M_N$ and $M_P$, respectively. Internal resistances $R_N$ and $R_P$ can be assumed for $sw_n$ and $sw_p$, respectively. During operation of the charge pump circuit output stage of FIG. 2, switch $sw_n$ is turned on by positive voltage pulses applied to the DOWN input, and switch $sw_p$ is turned on by negative voltage pulses applied to the UP input.

In an example, assuming that gate bias voltages $V_{BIASN}$ and $V_{BIASP}$ are selected such that $M_N$ and $M_P$ operate in the saturation region and conduct equal currents when $sw_n$ and $sw_p$ are on, either sinking or sourcing current pulses of substantially equal amplitude flow from or to the output node OUT of the charge pump circuit output stage, such as according to the UP and DOWN control inputs.

Figure 3:
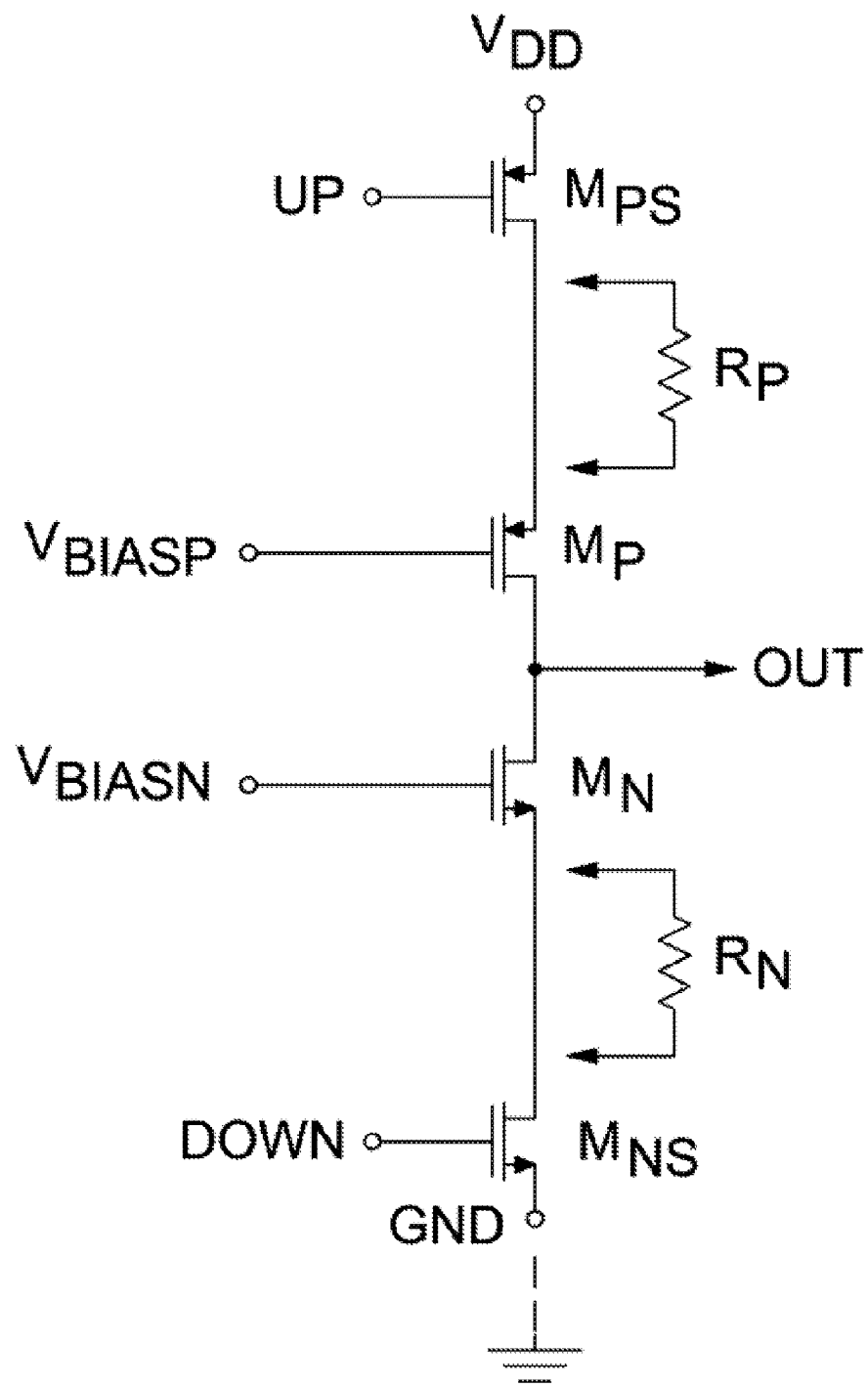
FIG. 3 illustrates generally an example of an implementation of the switches $sw_p$ and $sw_n$ using transistors.

FIG. 3 illustrates generally an example of a CMOS implementation of the switches $sw_n$ and $sw_p$ of FIG. 2. In the example of FIG. 3, the switches $sw_n$ and $sw_p$ are represented by transistors $M_{NS}$ and $M_{PS}$. Optional resistors $R_N$ and $R_P$ can be included in the example as shown.

Figure 4:
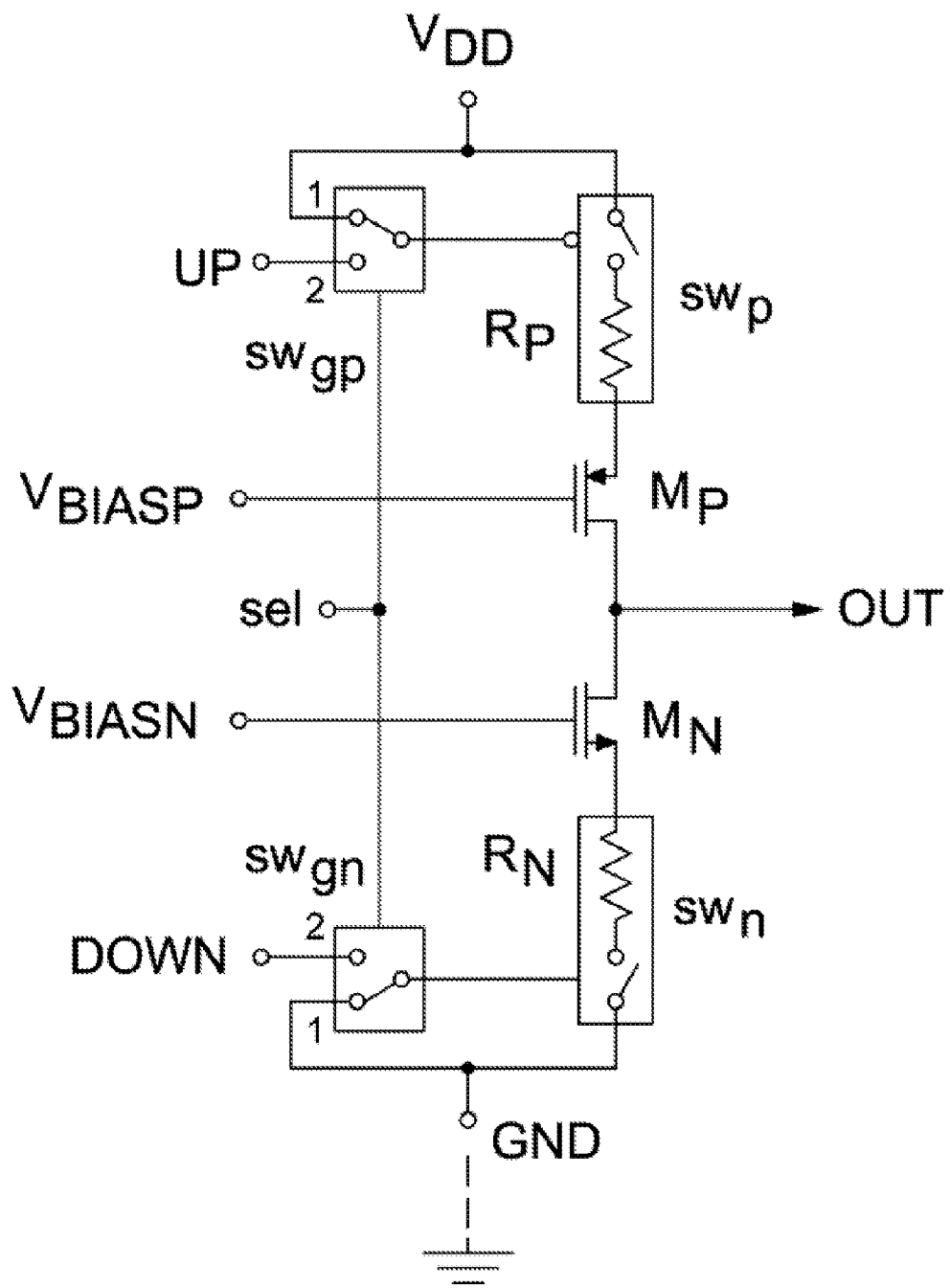
FIG. 4 illustrates generally an example of a circuit for enabling or disabling the output stage of FIG. 2

FIG. 4 illustrates generally an example of a charge pump circuit output stage, such as can be used in a programmable CMOS charge pump circuit. In addition to the circuit elements of the example of FIG. 2, the circuit of FIG. 4 includes additional gate switches $sw_{gn}$ and $sw_{gp}$. The additional gate switches $sw_{gn}$ and $sw_{gp}$ can be used to select a stage for use in the charge pump circuit according to a control signal sel. For example, for sel="0" (logic 0), $sw_{gn}$ and $sw_{gp}$ are in position 1, and $M_N$ and $M_P$ do not conduct any current because the gates of $sw_n$ and $sw_p$ are connected to GND and $V_{DD}$, respectively. For sel="1" (logic 1), $sw_{gn}$ and $sw_{gp}$ are in position 2, and the DOWN and UP control signals connect to the gates of $sw_n$ and $sw_p$, respectively. For sel="1", the charge pump circuit output stage of FIG. 4 functions similarly to the example of FIG. 2.

Figure 5:
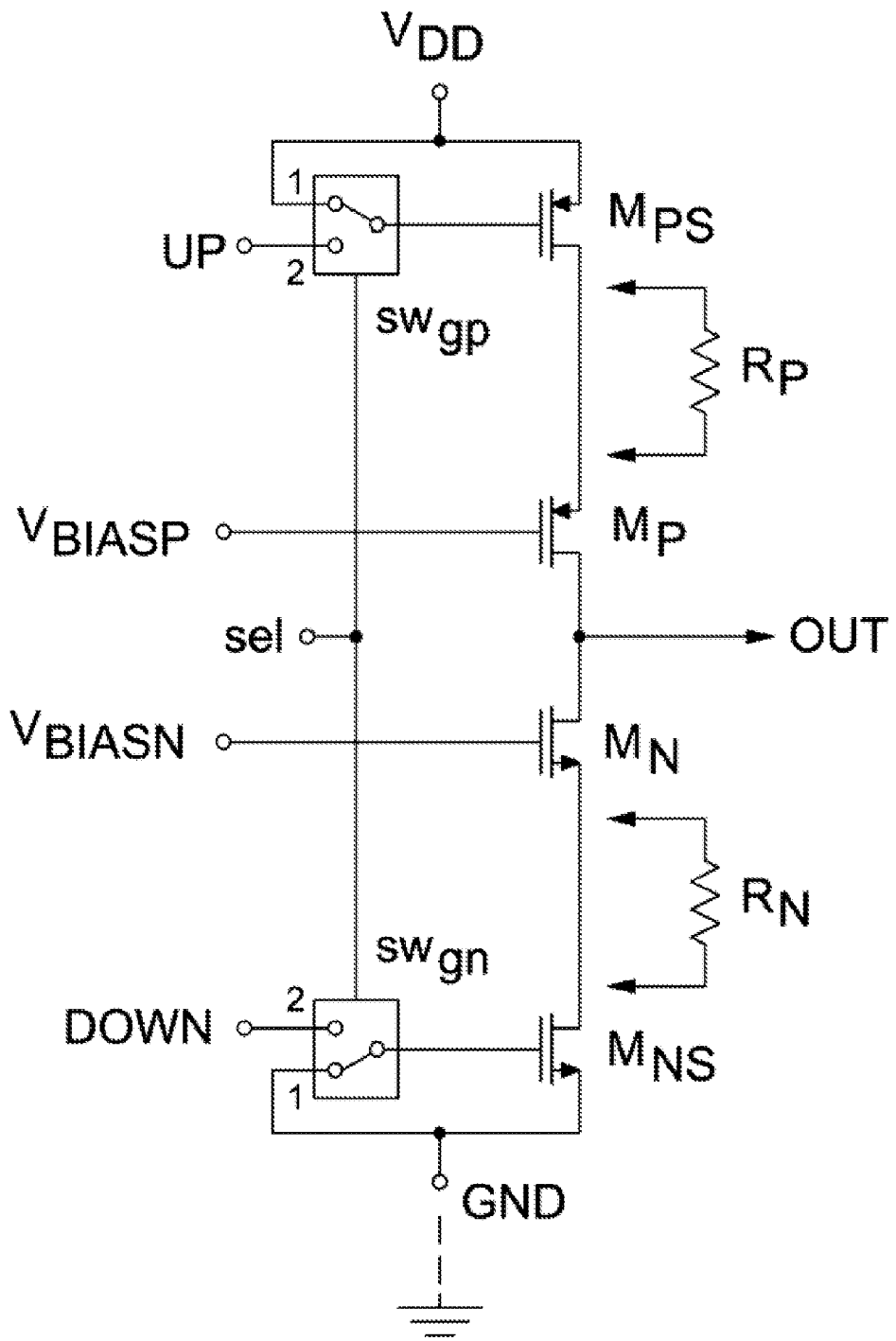
FIG. 5 illustrates generally an example of a charge pump output stage with enabling switches.

FIG. 5 illustrates generally an example of a CMOS implementation of the selectable output stage of FIG. 4. In the example of FIG. 5, the switches $sw_n$ and $sw_p$ of FIG. 4 are replaced by transistors $M_{NS}$ and $M_{PS}$ with optional resistances $R_N$ and $R_P$, respectively.

Figure 6:
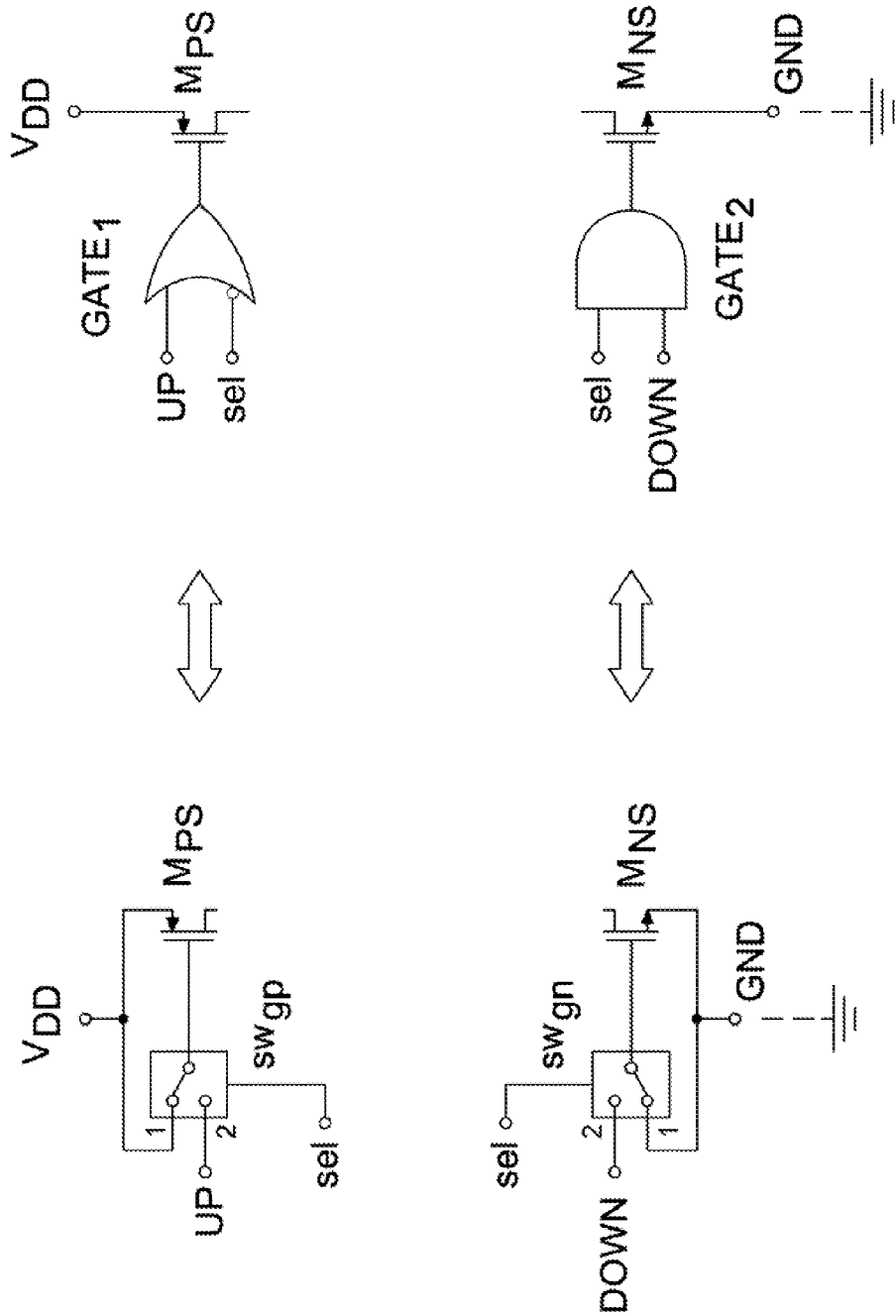
FIG. 6 illustrates generally examples of enabling switches implemented using logic gates.
Figure 7:
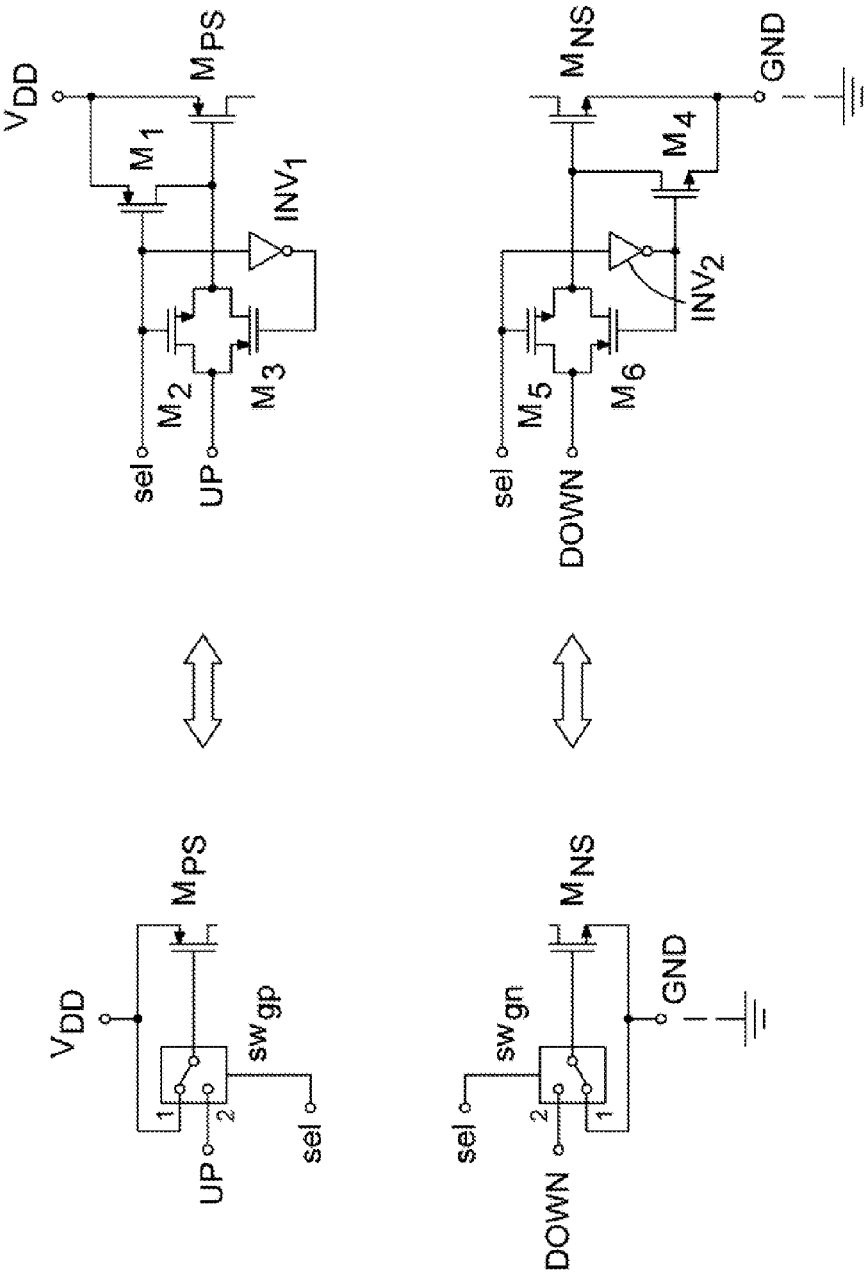
FIG. 7 illustrates generally examples of enabling switches implemented using transistors and inverters.

The additional gate switches $sw_{gn}$ and $sw_{gp}$ are illustrated as single-pole, double-throw switches, however, the switches can have other configurations, such as illustrated in FIGS. 6 and 7. In the example of FIG. 6, $sw_{gp}$ corresponds to $GATE_1$. $GATE_1$ includes an OR gate with a first terminal coupled to an UP signal node and a second, inverted terminal coupled to a sel signal node. The output of $GATE_1$ drives the gate of $M_{PS}$. In the example of FIG. 6, $sw_{gn}$ corresponds to $GATE_2$. $GATE_2$ includes an AND gate with a first terminal coupled to the sel signal node and a second terminal coupled to the sel signal node. The output of $GATE_2$ drives the gate of $M_{NS}$.

The example of FIG. 7 illustrates generally examples that include using a cascaded arrangement of transistors to implement $sw_{gn}$ and $sw_{gp}$. For example, in FIG. 7, $sw_{gp}$ corresponds to the transistor configuration of $M_1$, $M_2$, and $M_3$, with the sel signal node coupled to the gates of $M_1$ and $M_2$, and coupled via an inverter circuit $INV_1$ to the gate of $M_3$. The drain of $M_1$, which is also coupled to the source terminal of $M_2$ and the drain terminal of $M_3$, drives the gate of $M_{PS}$. In the example of FIG. 7, $sw_{gn}$ corresponds to the transistor configuration of $M_4$, $M_5$, and $M_6$, with the sel signal node coupled to the gate of $M_5$, and coupled via an inverter circuit $INV_2$ to the gates of $M_4$ and $M_6$. The drain of $M_4$, which is also coupled to the source terminal of $M_5$ and the drain terminal of $M_6$, drives the gate of $M_{NS}$. Other configurations can similarly be used. In the following figures, however, $sw_{gn}$ and $sw_{gp}$ are represented functionally as single-pole double-throw switches, as in FIGS. 4 and 5.

Figure 8:
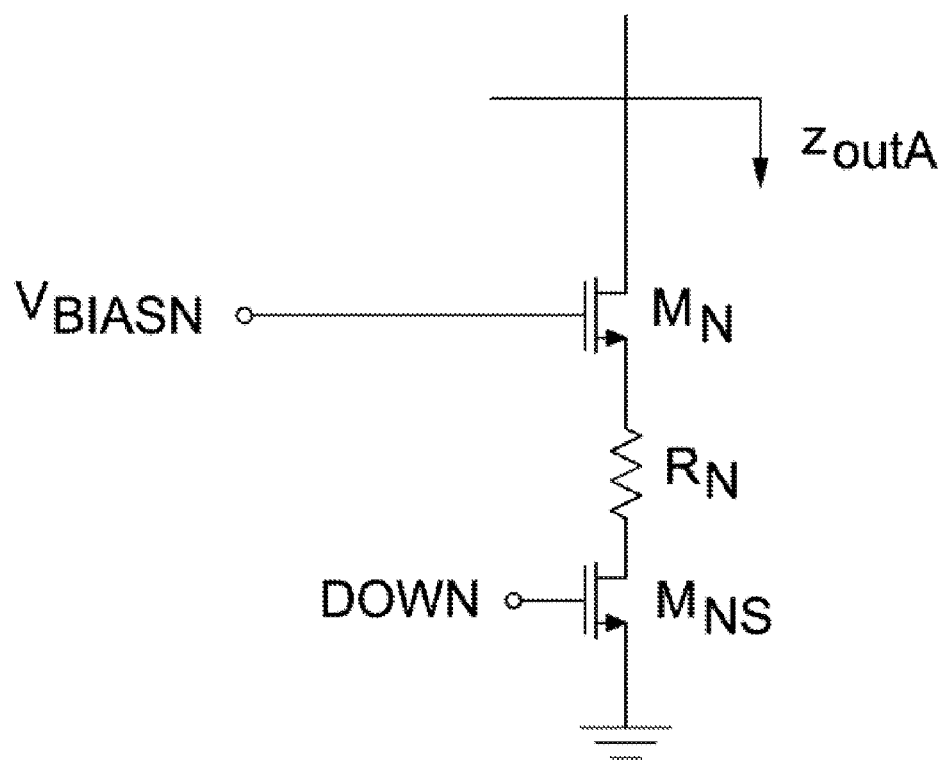
FIG. 8 illustrates generally an example of a current-sinking charge pump circuit portion.

FIG. 8 illustrates generally an example of a source-switching, current-sinking portion of a charge pump circuit output stage having an output impedance $z_{OUTA}$. In the example of FIG. 8, a large resistance $R_N$ relative to a resistance presented by $M_{NS}$ when $M_{NS}$ is on (i.e., when DOWN="1") can be desirable. Relatively large resistances $R_N$ in each stage of a programmable charge pump can be easier to match between identical or scaled stages in a programmable charge pump, such as compared to matching that relies only on the characteristics of other elements, such as the $M_{NS}$ switching transistor. When $R_N$ is large, $V_{BIASN}$ can similarly be large in order to provide a voltage drop across $R_N$ when $M_{NS}$ is on, such as to provide a minimum elementary charge pump circuit current to flow through $M_N$. In this example, transistor $M_N$ can be relatively physically large such that its gate-source voltage is sufficiently small when conducting current, thus ensuring that $V_{BIASN}$ is within specified limits (e.g., smaller than the supply voltage). Ensuring that $R_N$ is substantially larger than the on-resistance of $M_{NS}$ can also dictate that $M_{NS}$ itself is sufficiently large.

A design challenge related to the size of switches $M_N$ and $M_{NS}$ includes that minimum-length devices in a small-geometry process, such as 28 nm CMOS, can yield an unacceptably small output impedance $z_{OUTA}$ in an ON state, and can exhibit poor matching properties among different instances of the switches, such as across multiple stages of a charge pump circuit. One technique for overcoming this challenge includes using longer lengths (such as 100 nm) for both $M_N$ (e.g., to provide large output impedance) and $M_{NS}$ (e.g., to provide good matching). However, as a result, wider widths are also used in $M_N$ and $M_{NS}$ than would otherwise be dictated by simple voltage-drop or switch-resistance requirements.

Although larger or wider $M_N$ and $M_{NS}$ transistors can provide relatively predictable behavior in an ON state of the charge pump circuit stage, the parasitic effects of $M_N$ and $M_{NS}$ in the OFF state can contribute to an overall reduction in the output impedance of the charge pump circuit. When multiple stages are connected in parallel, such as in a programmable charge pump circuit, the parasitic effects of the transistors on the output impedance compound. A reduction in the charge pump output impedance can appear as an unwanted or parasitic impedance in the filter circuit of the PLL circuit, and can impact an overall PLL circuit performance, or can limit programmability or flexibility of the PLL. A design challenge therefore includes minimizing an impact of a device size, such as a switching transistor size, on a charge pump output impedance, while maintaining good matching among multiple different stages or legs in the charge pump circuit.

Figure 9:
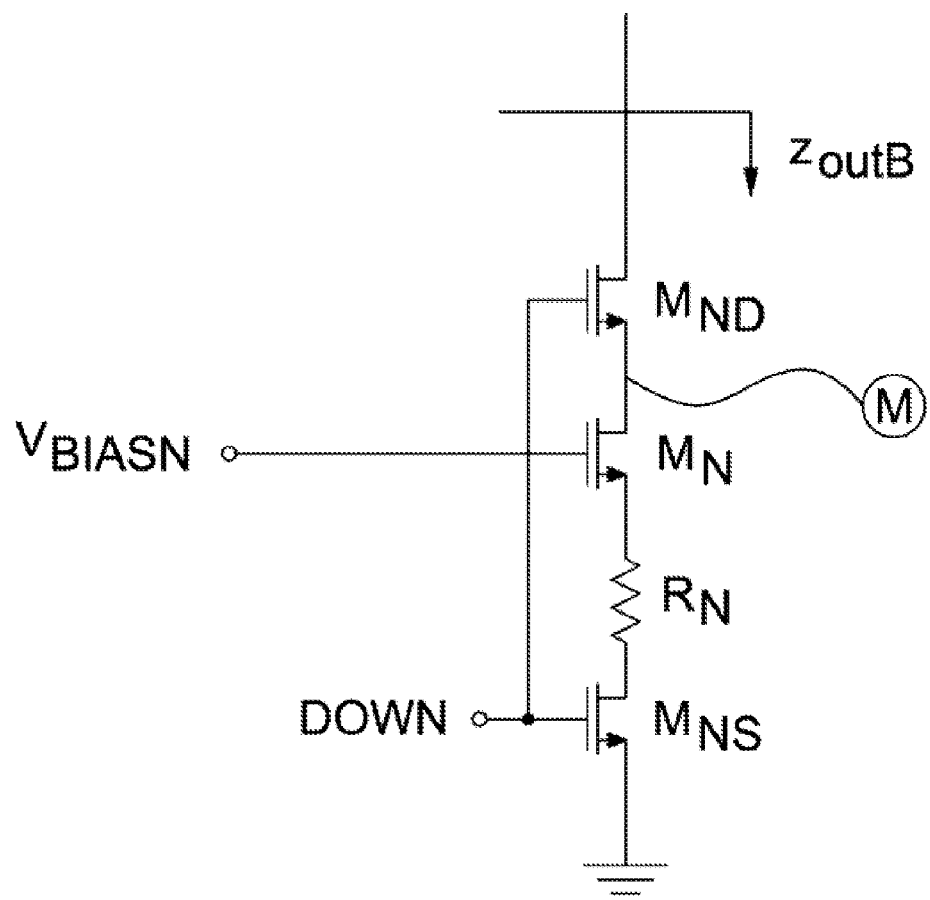
FIG. 9 illustrates generally an example of a current-sinking charge pump circuit portion with source and drain switching.

FIG. 9 illustrates generally an example of a source-switching, current-sinking portion of a charge pump circuit output stage having an output impedance $z_{OUTB}$. The example of FIG. 9 includes a switching transistor $M_{ND}$ provided in series with the drain of output transistor $M_N$ of FIG. 8. The gate of $M_{ND}$ can be driven by the same control signal (DOWN) as the gate of $M_{NS}$, such as to provide substantially simultaneous or concurrent switching of both the source and the drain of transistor $M_N$. Unlike $M_N$ and $M_{NS}$, which can be relatively large (e.g., W=40 μm, L=0.1 μm for $M_N$, or W=8 μm, L=0.2 μm for $M_{NS}$) to provide a sufficiently large output impedance and an acceptably small $V_{BIASN}$ for an elementary charge pump current such as 100 μA (e.g., using $R_N$ such as 1 kΩ), $M_{ND}$ can be relatively small (e.g., W=4 μm, L=30 nm, in a process such as 28 nm CMOS) to provide a relatively minor reduction in output voltage compliance (e.g., a small voltage drop across $M_{ND}$) and little effect on the output impedance, such as when $M_{ND}$ is in an ON state. In an OFF state (DOWN="0"), $M_{ND}$ can present a relatively small parasitic capacitance at the output node of the charge pump, such as compared to the parasitic capacitance of the larger $M_N$. Thus, when $M_{ND}$ is included as in the example of FIG. 9, an increase in the output impedance $z_{OUTB}$ relative to $z_{OUTA}$ (FIG. 8) can be realized.

In the example of FIG. 9, in an OFF state, node M (corresponding to the source terminal of $M_{ND}$) has an undefined potential when DOWN="0" because the gate of $M_{ND}$ is at ground, the drain of $M_{ND}$ is approximately $V_{DD}/2$ (e.g., the output voltage of the single-ended charge pump stage in normal operation), and a theoretically infinite impedance is connected between node M and ground. As a result, the source of $M_{ND}$ can assume a potential that is substantially lower than its drain potential, thereby limiting the output impedance in the OFF state.

Figure 10:
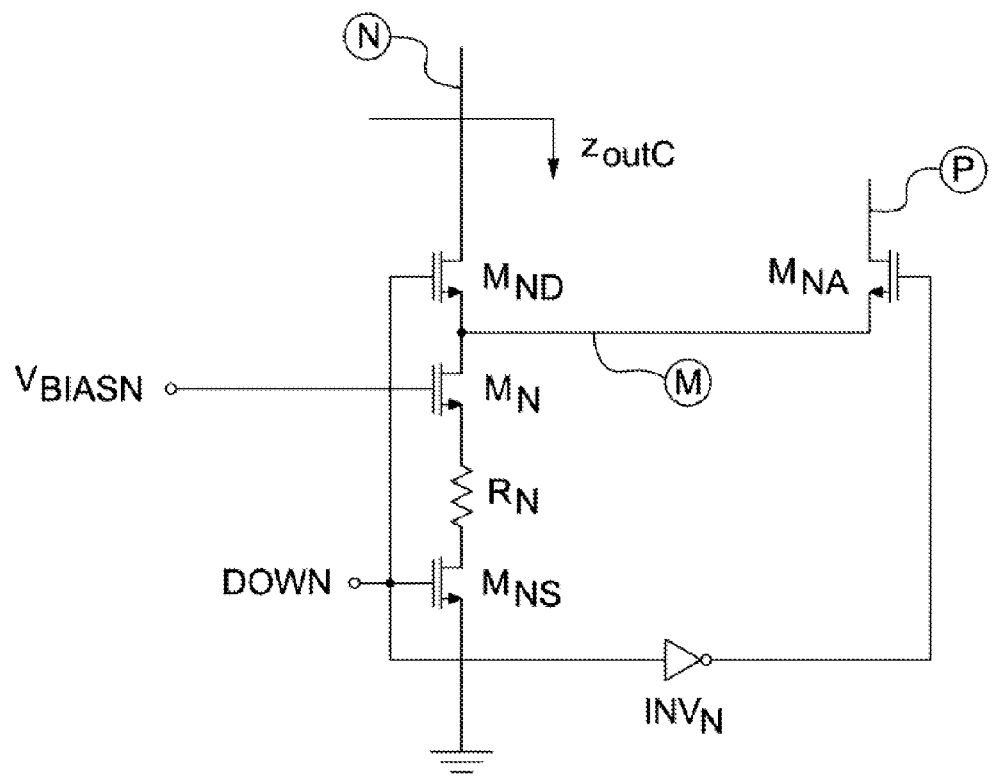
FIG. 10 illustrates generally an example of a current-sinking charge pump circuit portion with source and drain switching.

FIG. 10 illustrates generally an example of a source-switching, current-sinking portion of a charge pump circuit output stage having an output impedance $z_{OUTC}$. In the example of FIG. 10, node M can be forced to assume a relatively higher voltage when $M_N$ is in an OFF state, such as using inverter $INV_N$ and an additional drain switching device $M_{NA}$. The inverter $INV_N$ is coupled to the gate of $M_{NS}$ and $M_{ND}$, and the output of the inverter $INV_N$ drives the additional drain switching device $M_{NA}$. The source of $M_{NA}$ is coupled to the drain of $M_N$. In FIG. 10, node P (e.g., corresponding to the drain of $M_{NA}$) can assume the same potential as node N (e.g., corresponding to the output node of the charge pump circuit), such as to ensure a zero drain-source voltage across $M_{ND}$ when $M_N$ is in an OFF state. As a result, the example of FIG. 10 can exhibit a relatively high output impedance. In an example, when node P follows node N, charge is prevented from accumulating between $M_N$ and the output node of the charge pump circuit, for example, because the potential of the $M_N$ drain does not change during switching.

Figure 11:
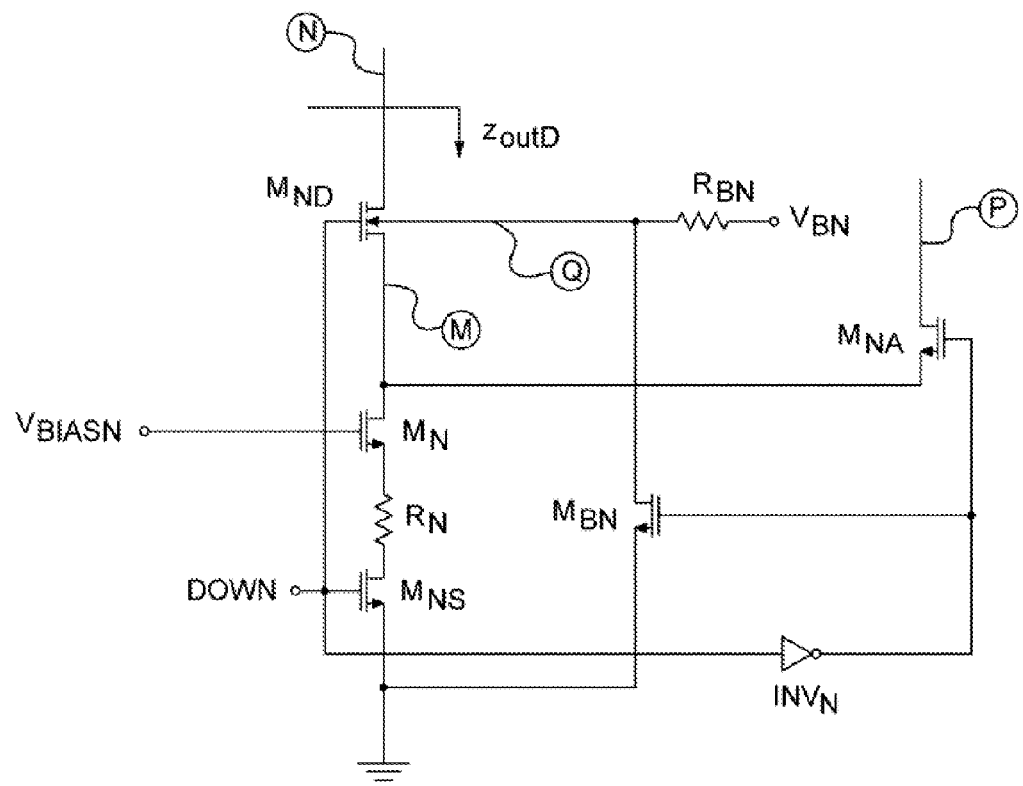
FIG. 11 illustrates generally an example of a current-sinking charge pump circuit portion with source and drain switching.

FIG. 11 illustrates generally an example of a source-switching, current-sinking portion of a charge pump circuit output stage having an output impedance $z_{OUTD}$. In the example of FIG. 11, a forward bias is provided at a body-source junction of $M_{ND}$ (see, e.g., FIG. 10) in an ON state, such as to improve the output impedance of the charge pump circuit when the stage including $M_N$ is in an OFF state. When a forward body-source bias at $M_{ND}$ is used, a relatively smaller-width minimum-length $M_{ND}$ can be used over the example of FIG. 10, while maintaining the same or similar performance in an ON state, and a relatively larger output impedance in the OFF state.

In the example of FIG. 11, a forward body-source bias at $M_{ND}$ can be provided by a voltage $V_{BN}$, such as can be about $0.75V_{DD}$ (e.g., for a 28 nm CMOS technology). A transistor $M_{BN}$ can be provided to switch the forward body-source bias at $M_{ND}$. In an ON state, transistor $M_{BN}$ can be off, and voltage $V_{BN}$ can provide a small (e.g., about $0.25V_{DD}$) forward body-source bias voltage to transistor $M_{ND}$ by means of resistor $R_{BN}$ (e.g., 10 KΩ or larger). In the example of FIG. 11, in an OFF state, transistor $M_{BN}$ is on, and the body node of $M_{ND}$ is pulled to ground, thereby providing a circuit similar to that in the example of FIG. 10, however having lesser parasitic effects due to the relatively smaller $M_{ND}$.

Figure 12:
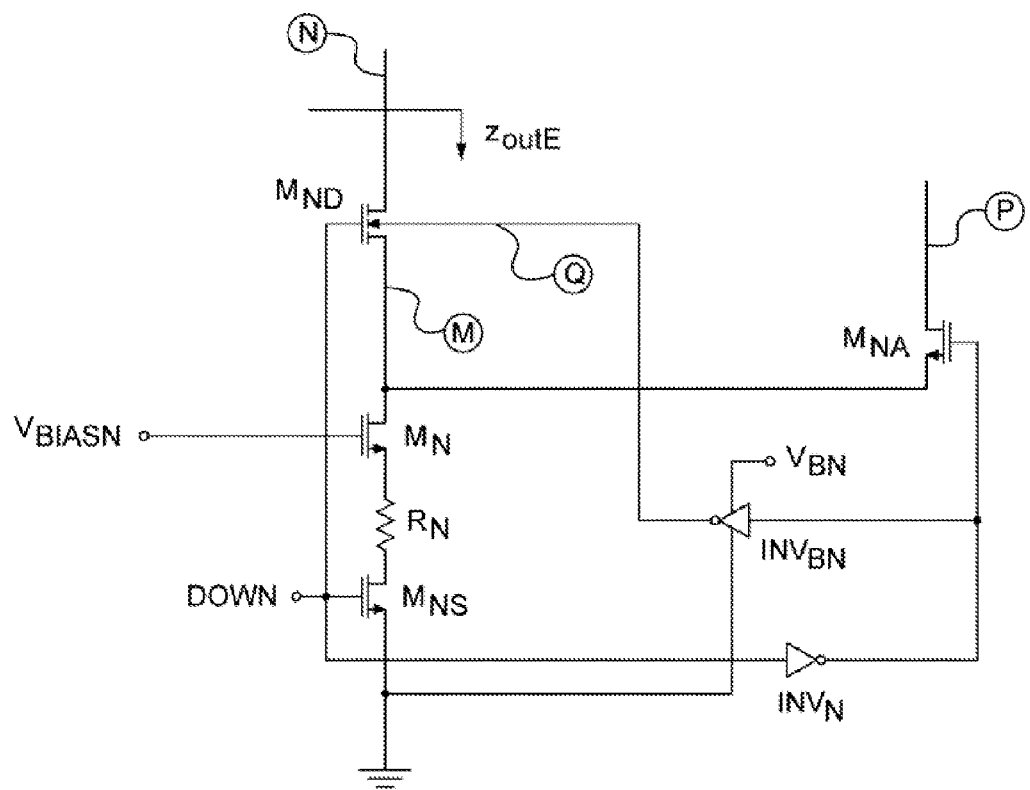
FIG. 12 illustrates generally an example of a current-sinking charge pump circuit portion with source and drain switching.

FIG. 12 illustrates generally an example of a source-switching, current-sinking portion of a charge pump circuit output stage having an output impedance $z_{OUTE}$. Alternatively to the example of FIG. 11, FIG. 12 includes a technique for providing a forward bias at a body-source junction of $M_{ND}$. In the example of FIG. 12, an inverter circuit $INV_{BN}$ is coupled between the body node of $M_{ND}$ and ground. In response to the status of the control signal DOWN, the inverter circuit $INV_{BN}$ selectively provides a forward body-source voltage bias to $M_{ND}$ when $M_N$ is in an ON state.

Figure 13:
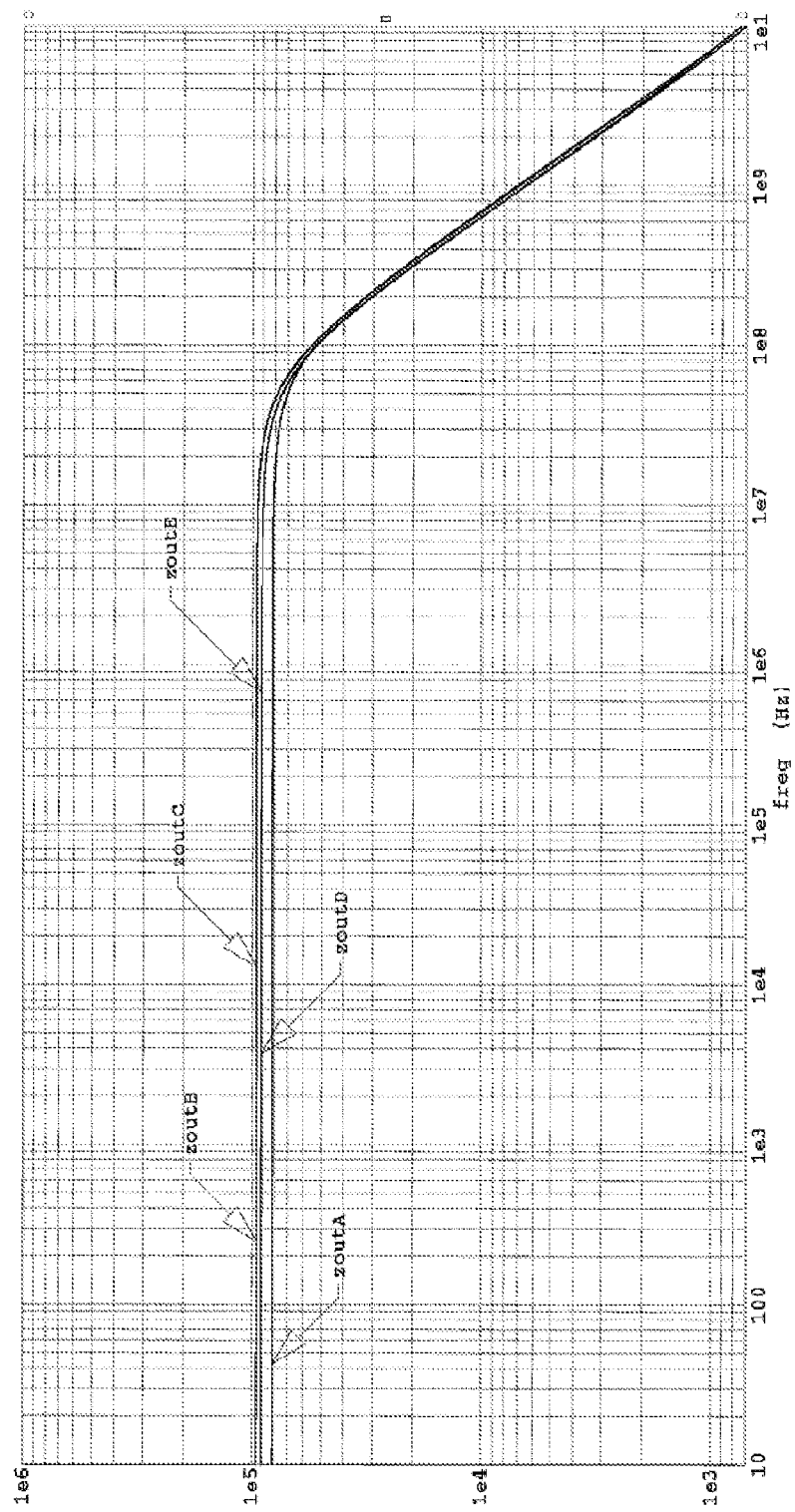
FIG. 13 illustrates generally an example of a simulation result showing small-signal output impedances of the charge pump circuit portions according to FIGS. 8-12.
Figure 14:
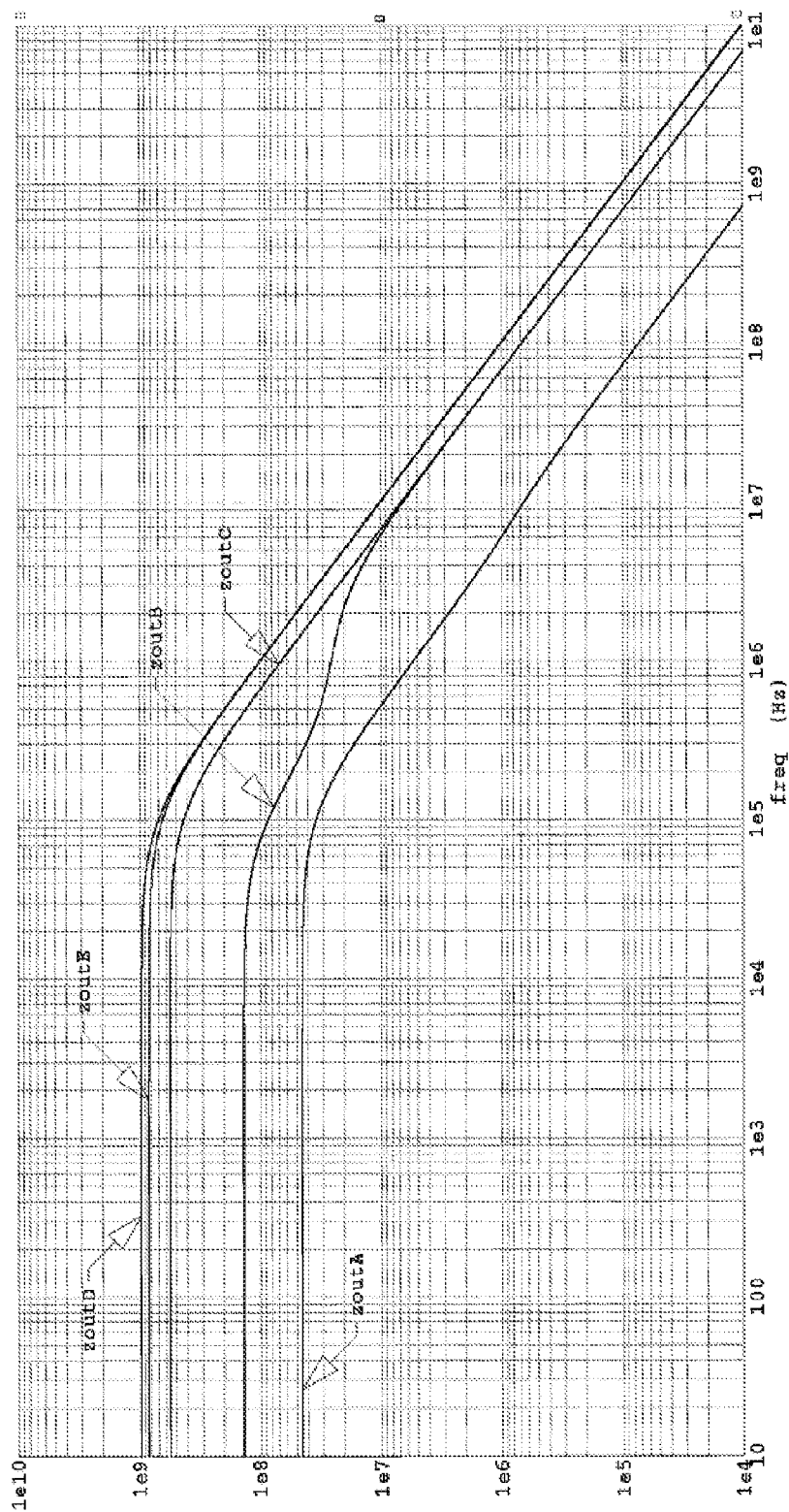
FIG. 14 illustrates generally an example of a simulation result showing small-signal output impedances of the charge pump circuit portions according to FIGS. 8-12.

FIGS. 13 and 14 illustrate generally output impedance plots corresponding to circuit simulations of the example topologies of FIGS. 8-12. For example, FIG. 13 illustrates output impedance information vs. frequency for each of $z_{OUTA}$ (FIG. 8), $z_{OUTB}$ (FIG. 9), $z_{OUTC}$ (FIG. 10), $z_{OUTD}$ (FIG. 11), and $z_{OUTE}$ (FIG. 12) for MN in an ON state. In the example of FIG. 13, the output impedance for each topology is substantially similar. The example of FIG. 14 illustrates output impedance information for each of FIGS. 8-12 for $M_N$ in an OFF state. As shown for the OFF state in the example of FIG. 14, $z_{OUTB}$ provides greater output impedance relative to $z_{OUTA}$, $z_{OUTC}$ provides greater output impedance relative to $z_{OUTB}$, and $z_{OUTD}$ and $z_{OUTE}$ provide greater output impedance relative to $z_{OUTC}$.

Although the examples of FIGS. 8-12 generally correspond to current-sinking portions of a charge pump circuit, the topologies of these examples can be similarly applied to current-supplying portions of the same or different charge pump circuits, such as further described herein.

Figure 15:
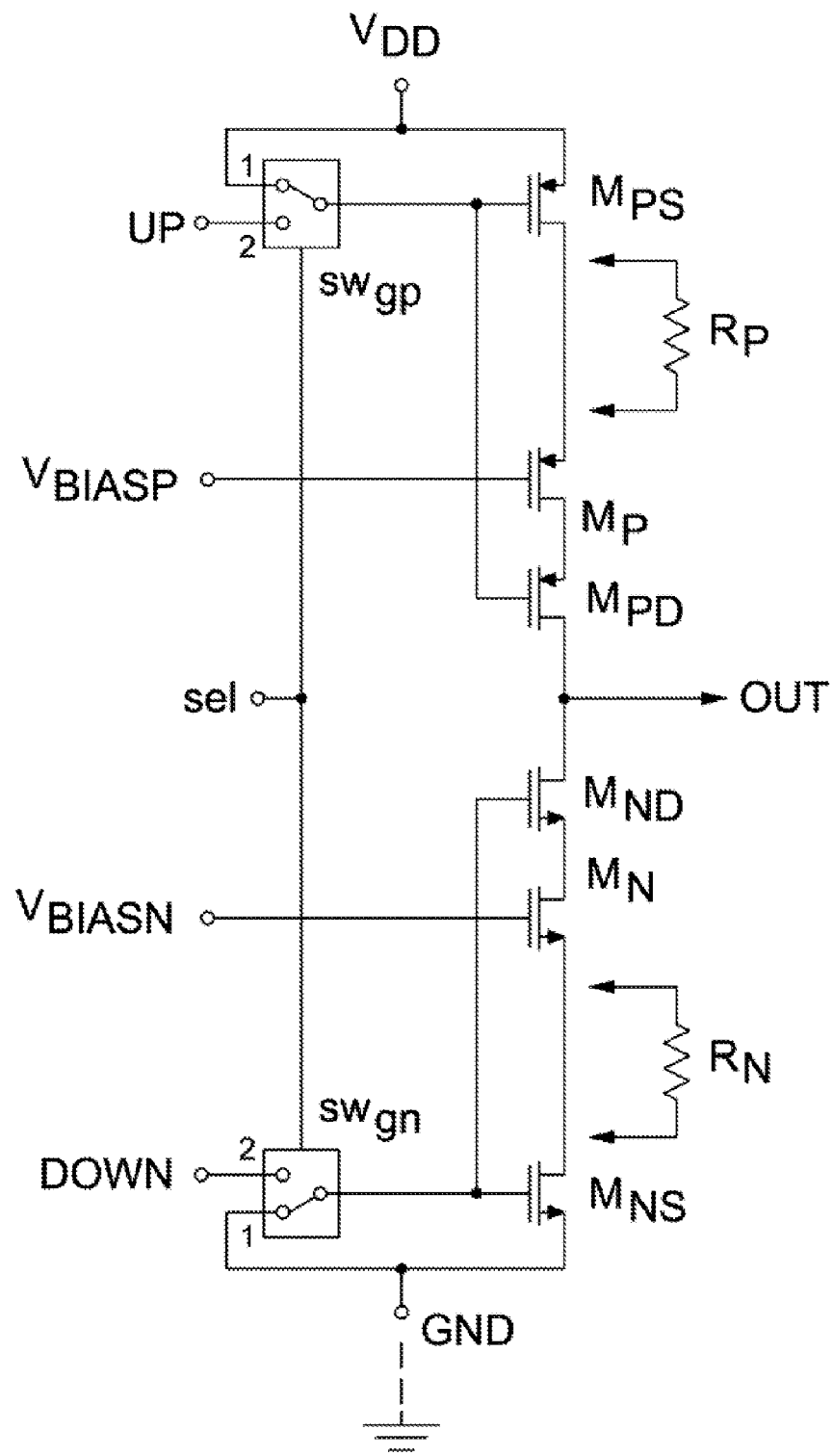
FIG. 15 illustrates generally an example of a charge pump circuit output stage with an output impedance characteristic that can be modified by a control signal.

FIG. 15, for example, illustrates generally an example that includes pullup and pulldown transistors $M_P$ and $M_N$. The example of FIG. 15 includes a representation of a substantially complete, selectable output stage of a programmable charge pump circuit. In the example of FIG. 15, a charge sinking section of the charge pump circuit includes $M_N$, $M_{NS}$, $M_{ND}$, and optional resistor $R_N$, such as similarly to the example circuit of FIG. 9. In the example of FIG. 15, a charge sourcing or supplying section of the charge pump circuit includes $M_P$, $M_{PS}$, $M_{PD}$, and optional resistor $R_P$, such as having a similar but complementary topology to the charge sinking section. In an example, the circuit of FIG. 15 can be enabled or disabled using control signal sel and switches $sw_{gn}$ and $sw_{gp}$, such as according to the description of the example of FIG. 5.

Figure 16:
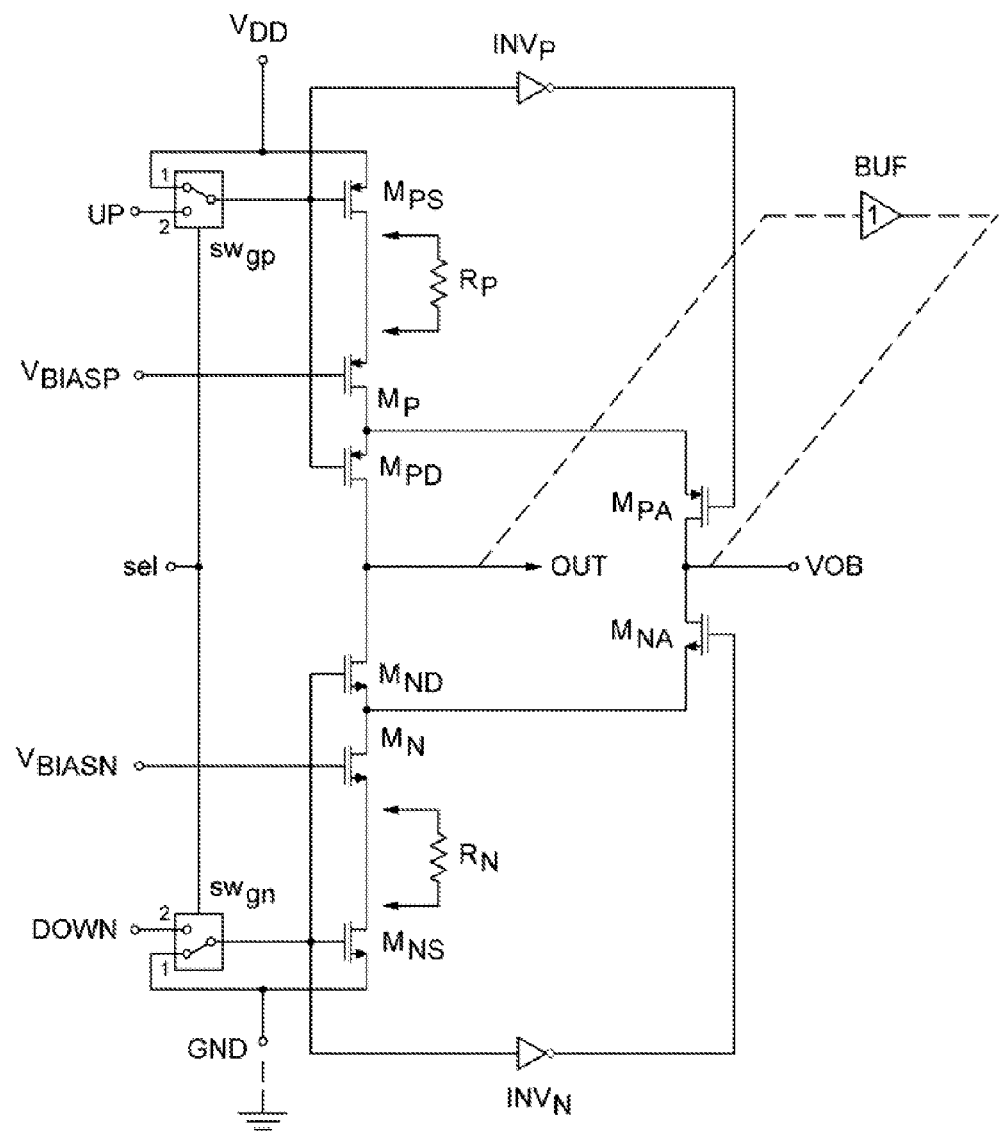
FIG. 16 illustrates generally an example of a charge pump circuit output stage with an output impedance characteristic that can be modified by a control signal.
Figure 17:
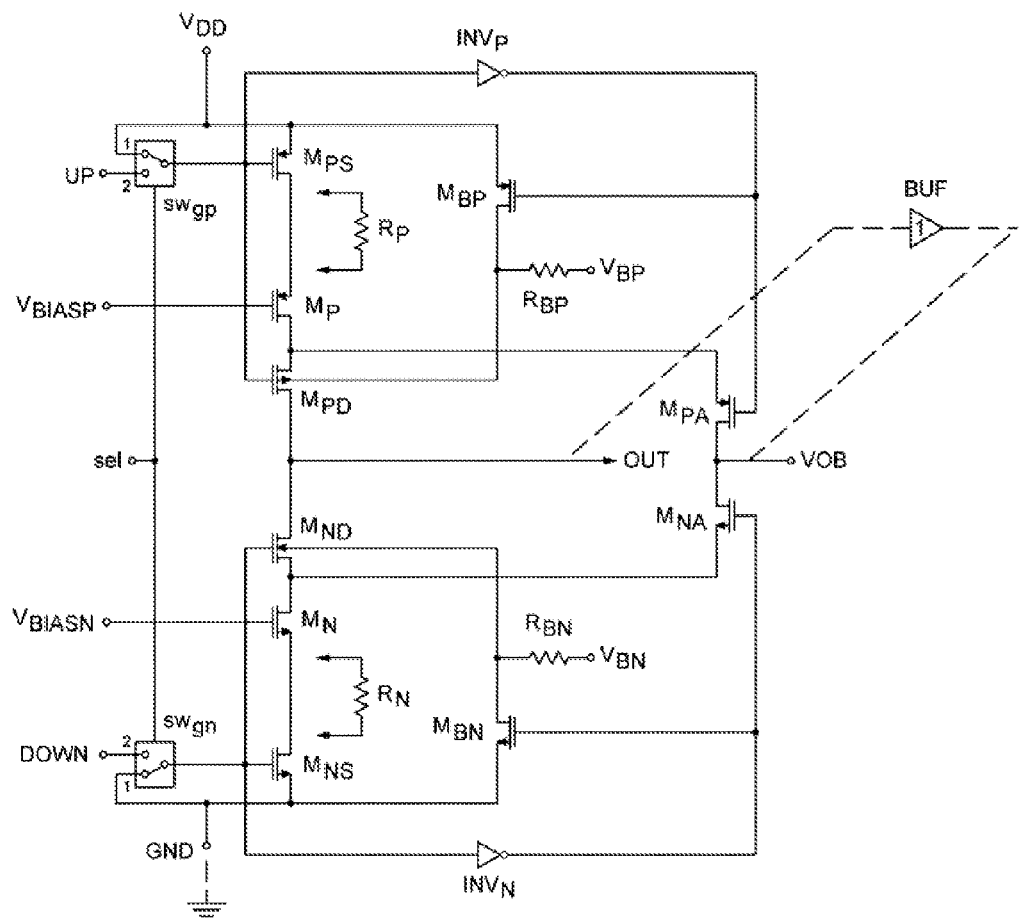
FIG. 17 illustrates generally an example of a charge pump circuit output stage with an output impedance characteristic that can be modified by a control signal.
Figure 18:
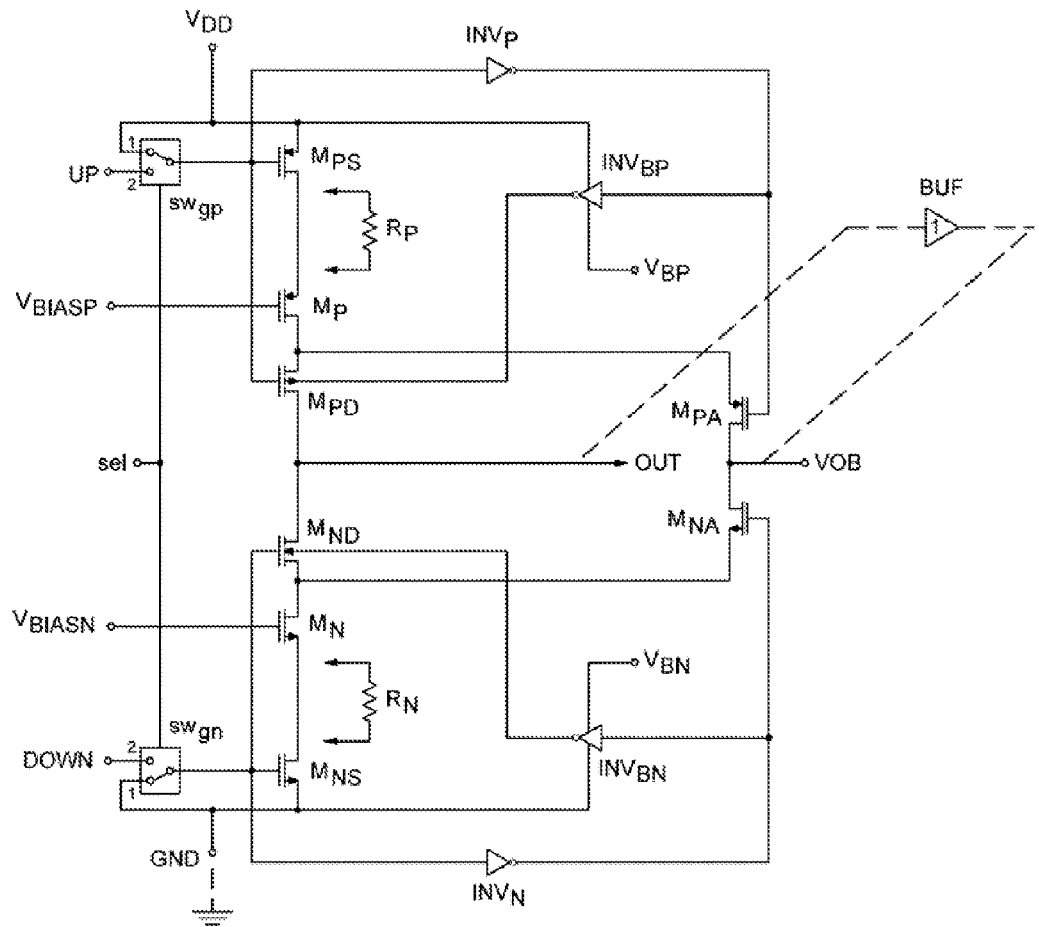
FIG. 18 illustrates generally an example of a charge pump circuit output stage with an output impedance characteristic that can be modified by a control signal.

Similar selectable output stages using the concepts illustrated in FIGS. 10-12 are shown in the examples of FIGS. 16-18, respectively. For example, FIGS. 16-18 include corresponding, complementary charge-supplying sections for each of the examples of FIGS. 10-12, and include the enabling/disabling functionality provided by control signal sel and switches $sw_{gn}$ and $sw_{gp}$.

In the examples of FIGS. 16-18, a unity-gain buffer circuit BUF couples the drains of additional switching transistors $M_{NA}$ and $M_{PA}$ to a voltage that can be about the same or equal to a voltage at the output node of the charge pump circuit, such as to inhibit or prevent charge sharing between the drains of the charge pump circuit transistors $M_N$ and $M_P$ and the charge pump output node. As further described herein, because the buffer circuit BUF has only a minimal output driving capability (e.g., because BUF drives transistors that do not themselves conduct any DC current), their presence is not required in the circuit, and node VOB can optionally be connected to another voltage that follows the voltage at the output node OUT. For example, a voltage from a bias stage of the charge pump circuit can be used. In an example, body voltages $V_{BN}$ and $V_{BP}$ can be chosen at values such as $0.75V_{DD}$ and $0.25V_{DD}$, respectively, for a technology such as 28 nm CMOS.

Figure 19:
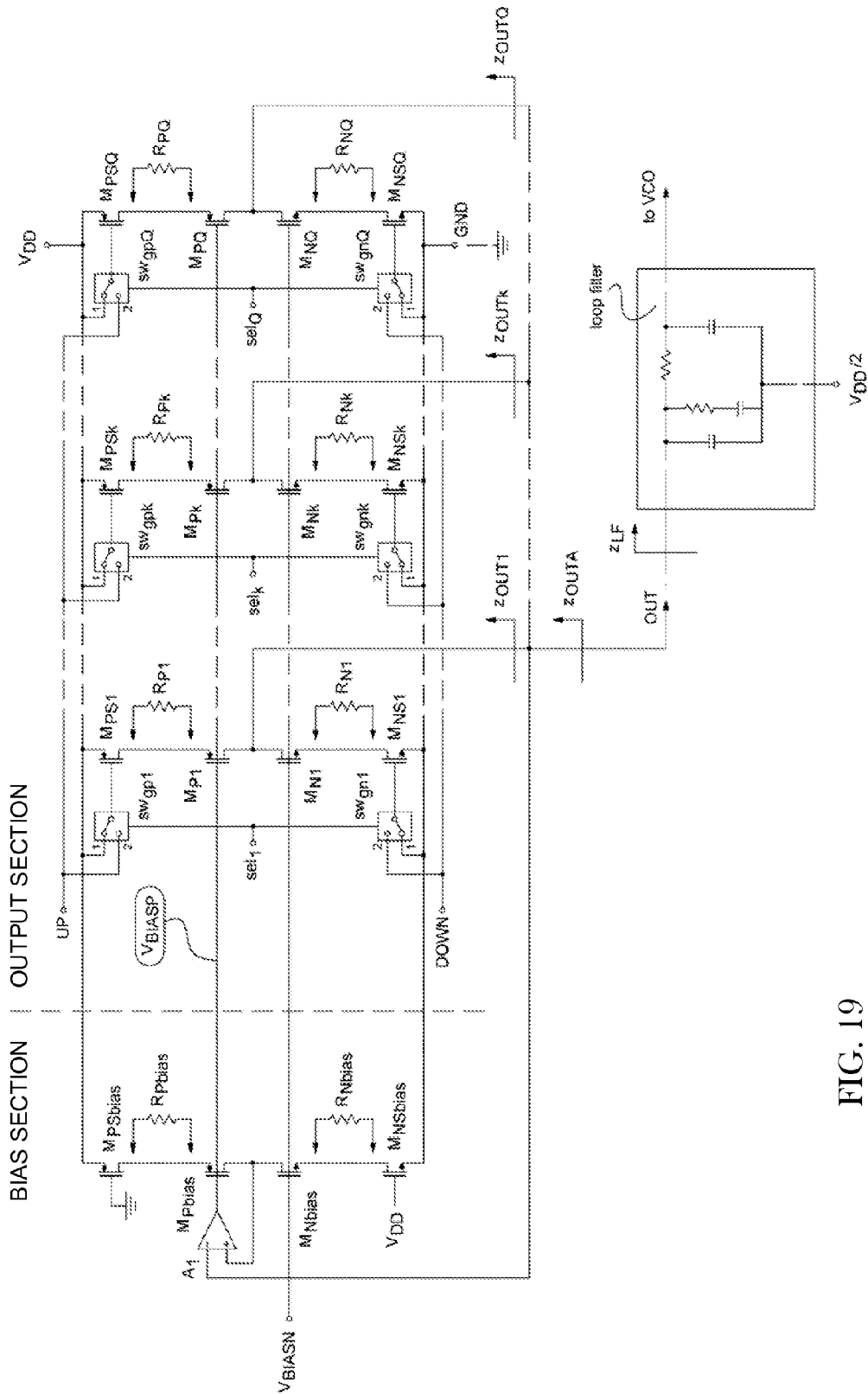
FIG. 19 illustrates generally an example of a programmable charge pump circuit with feedback-enhanced current matching.

FIG. 19 illustrates generally an example of a charge pump circuit with a bias section and an output section. The example of FIG. 19 includes feedback-enhanced current matching and uses, in the output section, multiple instances of an output stage configuration similar to that in the example of FIG. 5. The bias section is configured to generate a bias voltage $V_{BIASP}$ that drives the gates of $M_{P1}$, $M_{Pk}$, etc., in the output section. The output section of the charge pump circuit includes multiple, substantially identical or substantially identically-scaled output stages comprised of devices $M_{Nk}$, $M_{Pk}$, $M_{NSk}$, $M_{PSk}$, optional resistors $R_{Nk}$, $R_{Pk}$, and switches $sw_{gnk}$, $sw_{gpk}$, such as can be selectable by control signals $sel_k$, for k=1, . . . , Q. The bias section can mimic a topology or one or more circuit parameters of the output section, such as to provide close matching between the sinking and the sourcing currents of the charge pump circuit. Operational amplifier $A_1$ can be used to ensure that the output voltage of the charge pump circuit is substantially reproduced at the bias section, which can help to enhance current matching.

In the example of FIG. 19, the PLL loop filter accepts an output current from the charge pump, and provides a control voltage to the VCO. The output impedance $z_{OUTA}$ of the full programmable charge pump can be determined by the parallel combination of the output impedances of the individual sections, $z_{OUT1}, \ldots, z_{OUTQ}$, respectively, and, for the example of FIG. 19, the output impedance can be relatively low if Q is large (e.g., 64).

Figure 20:
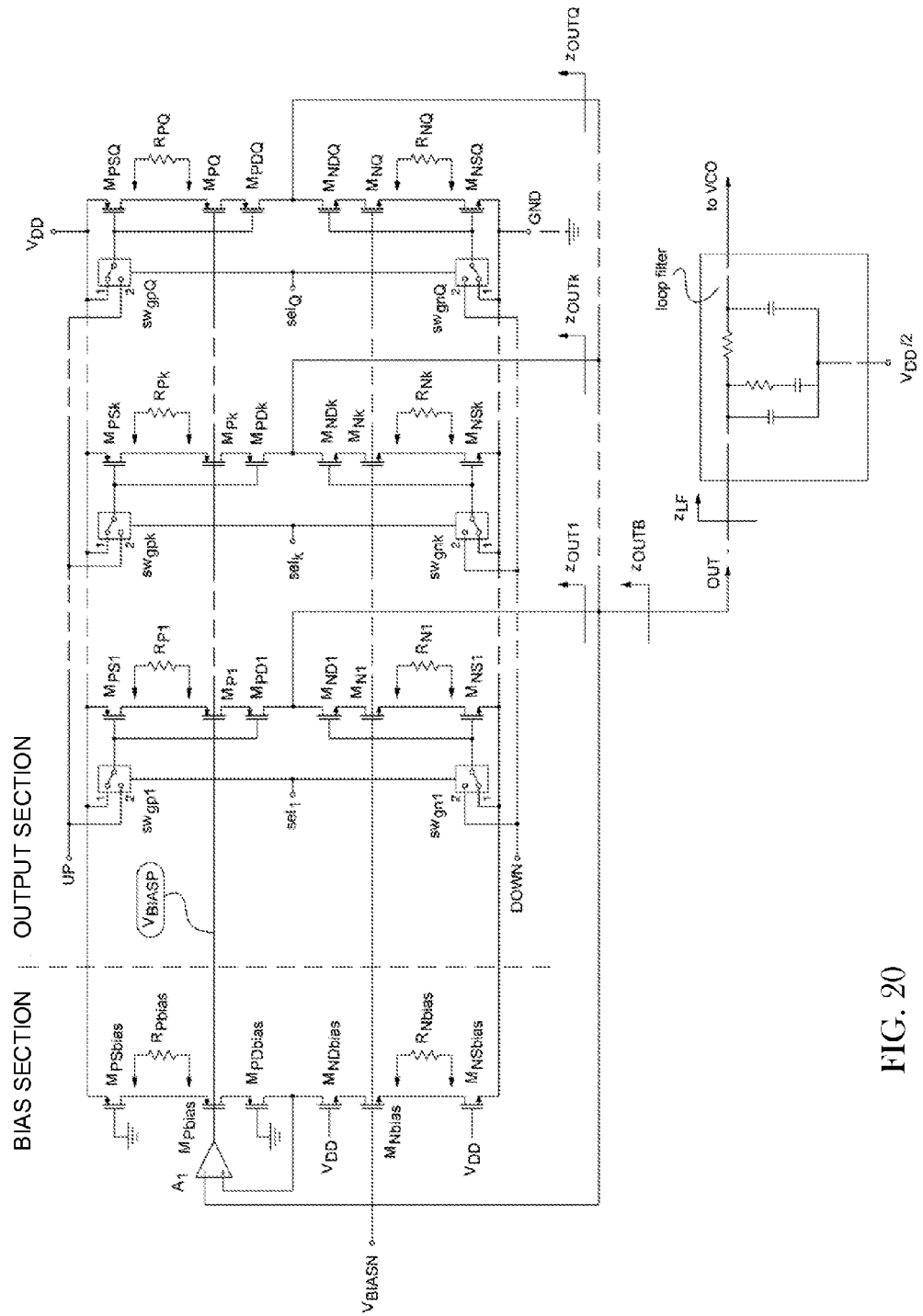
FIG. 20 illustrates generally an example of a programmable charge pump circuit with feedback-enhanced current matching.

FIG. 20 illustrates generally an example of a programmable charge pump circuit with a bias section and an output section with improved output impedance over the example of FIG. 19. The example of FIG. 20 includes feedback-enhanced current matching and uses, in the output section, multiple instances of an output stage configuration similar to that in the example of FIG. 15.

In the example of FIG. 20, additional switching devices $M_{NDk}$ and $M_{PDk}$, for k=1, ..., Q, can be used to improve the charge-pump output impedance for any one or more of the output stages in an OFF state. The bias section of the charge pump circuit also reflects the topology of the output section by including appropriately scaled devices $M_{NDbias}$ and $M_{PDbias}$.

In an example, the bias section and output section of FIG. 20 are used together as a charge pump circuit for use in a PLL circuit. The charge pump circuit is configured to source or sink a signal at an output node (OUT), and the output node can be coupled to a loop filter or VCO in the PLL circuit. In the example of FIG. 20, the charge pump circuit's bias section is configured to receive a feedback signal, based on a signal at the output node (OUT), and to provide a bias signal based on the received feedback signal. The charge pump circuit's output section includes at least a first pump stage that is configured to at least one of source or sink current to the output node (OUT) of the charge pump circuit. In an example, the first pump stage includes a pullup field-effect transistor (FET), including a gate biased by the bias signal, a drain, and a source, wherein the drain and source are substantially concurrently or simultaneously switched by first and second FET switches respectively associated with the drain and source, such as to switch the pullup FET between current conducting and non-conducting states with respect to the output node of the charge pump. In an example, the first pump stage additionally or alternatively includes a pulldown FET, including a gate biased by the bias signal, a drain, and a source, wherein the drain and source are substantially concurrently or simultaneously switched by third and fourth FET switches respectively associated with the drain and source, such as to switch the pulldown FET between current conducting and non-conducting states with respect to the output node of the charge pump. In an example, when the first pump stage is in an enabled state, both of the first and second FET switches can switch the pullup FET into a conducting state, or both the third and fourth FET switches can switch the pulldown FET into a conducting state.

Figure 21:
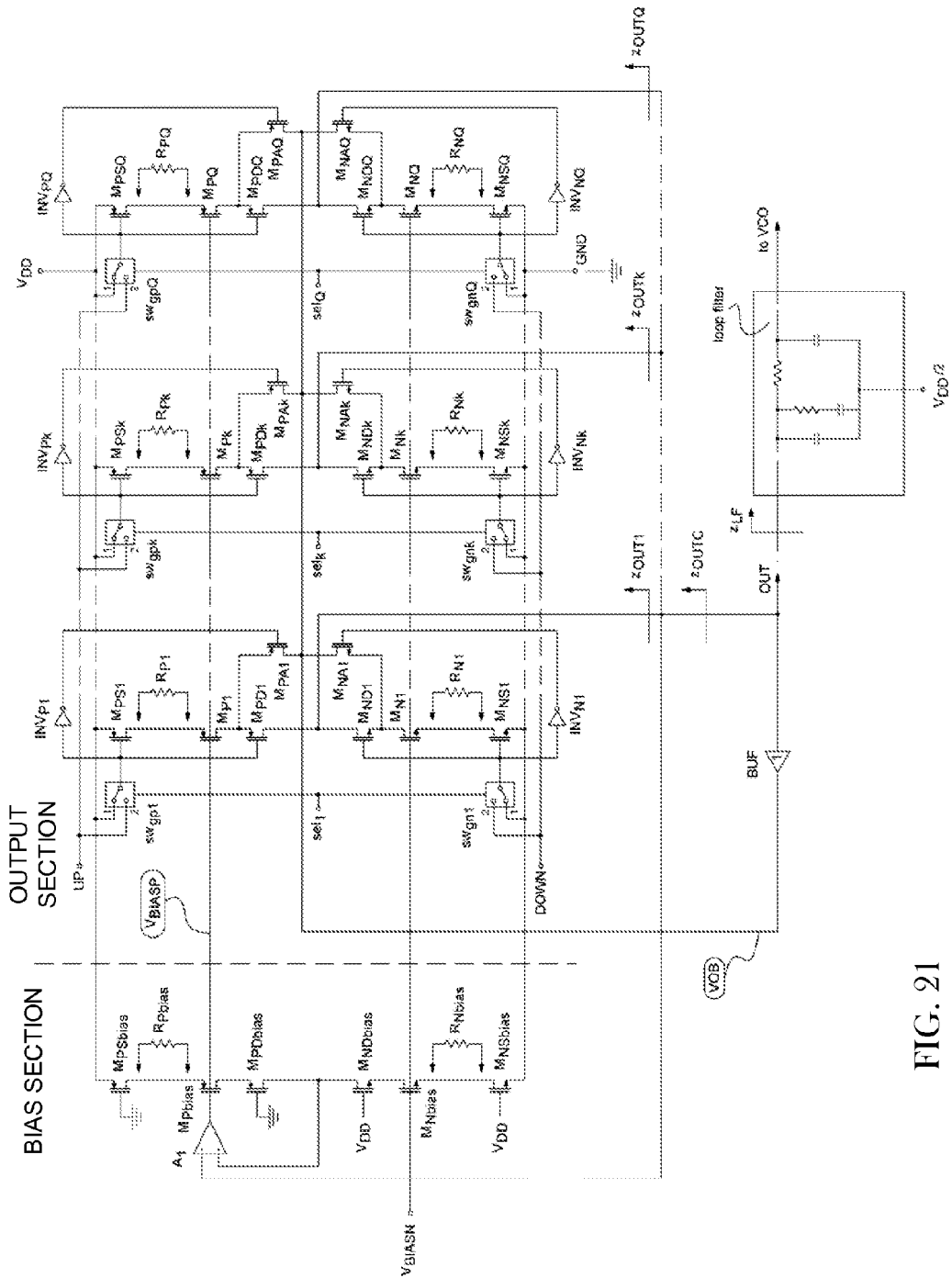
FIG. 21 illustrates generally an example of a programmable charge pump circuit with feedback-enhanced current matching and a buffer for reducing charge sharing.

FIG. 21 illustrates generally an example of a programmable charge pump circuit with a bias section and an output section with improved output impedance over the example of FIG. 20. With the exception of individual unity-gain buffers, the example of FIG. 21 uses a full complementary charge pump stage such as corresponding to the example of FIG. 16.

In the example of FIG. 21, a unity-gain buffer circuit BUF is used to prevent charge sharing between the charge pump circuit's switching devices and the output node of the charge pump circuit. Relative to the example of FIG. 20, additional switching devices $M_{NAk}$ and $M_{PAk}$, and inverter circuits $INV_{Nk}$ and $INV_{Pk}$, for k=1, ..., Q, can be used to further enhance or increase an output impedance of the charge pump circuit when one or more stages in the output section are in an OFF state. The bias section of the charge pump circuit also reflects the topology of the output section by including appropriately scaled devices $M_{NDbias}$ and $M_{PDbias}$.

Figure 22:
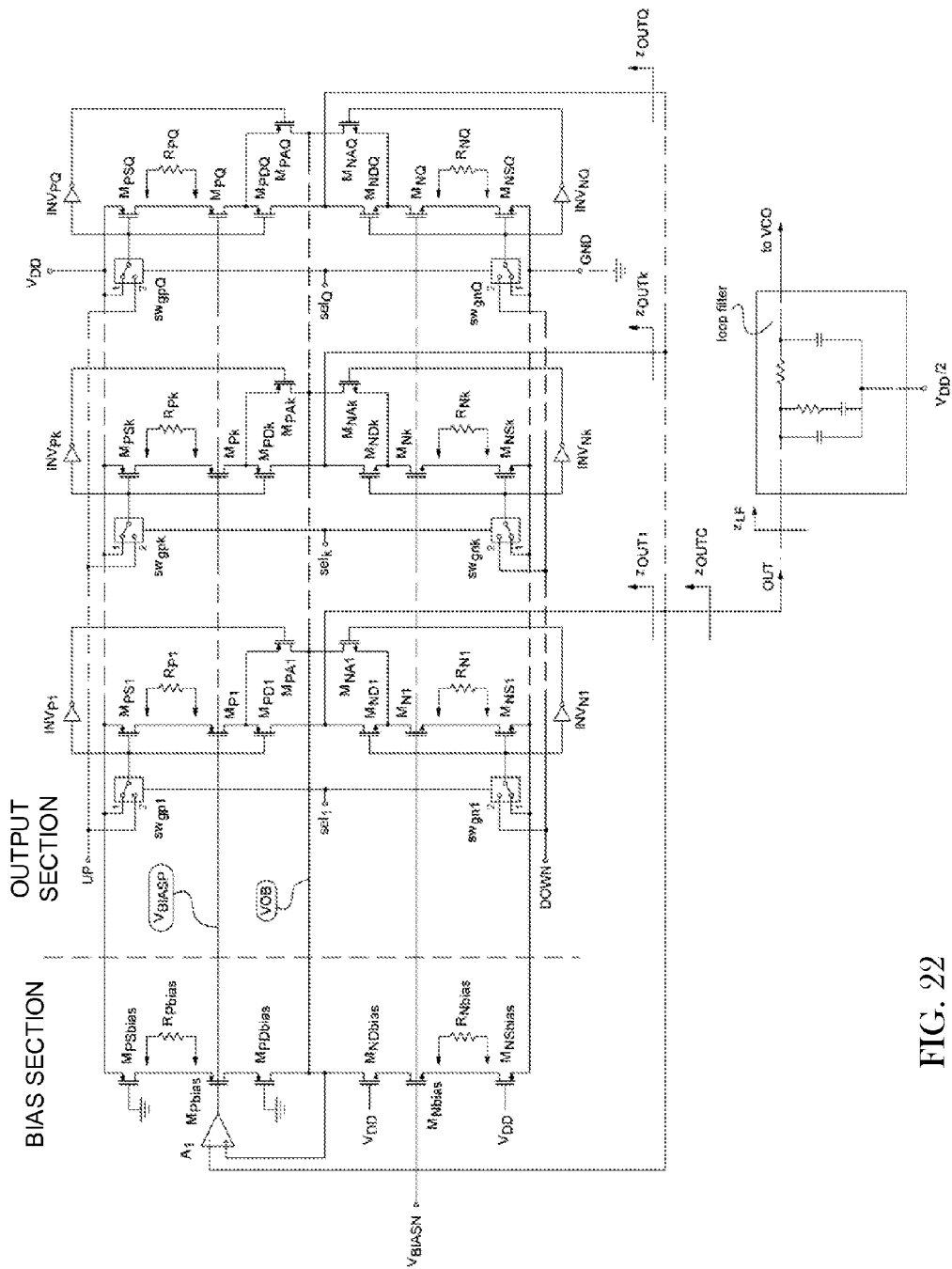
FIG. 22 illustrates generally an example of a programmable charge pump circuit with feedback-enhanced current matching.

FIG. 22 illustrates generally an example of a programmable charge pump circuit with a bias section and an output section with improved output impedance. The example of FIG. 22 is similar to the example of FIG. 21, with an exception of the unity-gain buffer circuit BUF being replaced in the example of FIG. 22 with a connection to the drains of transistors $M_{NDbias}$ and $M_{PDbias}$ in the bias section. In the example of FIG. 22, voltages at nodes VOB and OUT are substantially equal, no additional circuitry is required for the unity-gain buffer circuit, and charge sharing is substantially minimized or prevented.

Figure 23:
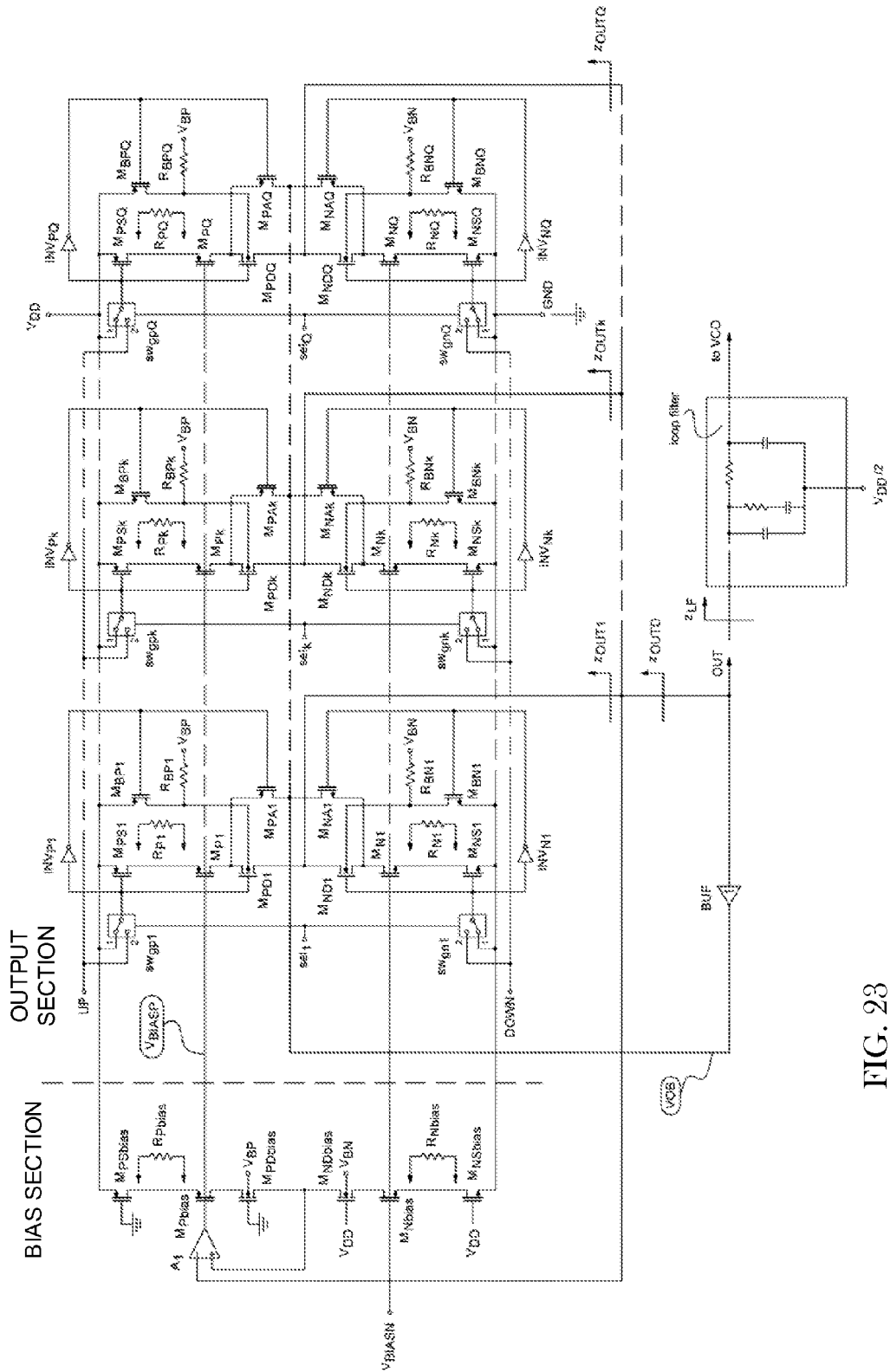
FIG. 23 illustrates generally an example of a programmable charge pump circuit with feedback-enhanced current matching and a buffer for reducing charge sharing.

FIG. 23 illustrates generally an example of a programmable charge pump circuit with a bias section and an output section with improved output impedance. With the exception of the individual unity-gain buffer circuits BUF, the example of FIG. 23 uses multiple instances of the charge pump output stage as provided in the example of FIG. 17. The example of FIG. 23 includes one unity-gain buffer circuit BUF to prevent charge sharing between the charge pump circuit's switching devices and the output node.

Relative to FIG. 21, additional transistors $M_{BNk}$, $M_{BPk}$, and resistors $R_{BNk}$, $R_{BPk}$, for k=1, ..., Q, as well as additional body bias voltages $V_{BN}$ and $V_{BP}$, are used in the example of FIG. 23 to increase the charge pump circuit's output impedance when any one or more of the circuit's output stages is in an OFF state. The bias section of the charge pump circuit of FIG. 23 reflects the topology of the output section by including appropriately scaled devices $M_{NDbias}$ and $M_{PDbias}$. The body nodes of devices $M_{NDbias}$ and $M_{PDbias}$ can be coupled to voltages $V_{BN}$ and $V_{BP}$, respectively.

Figure 24:
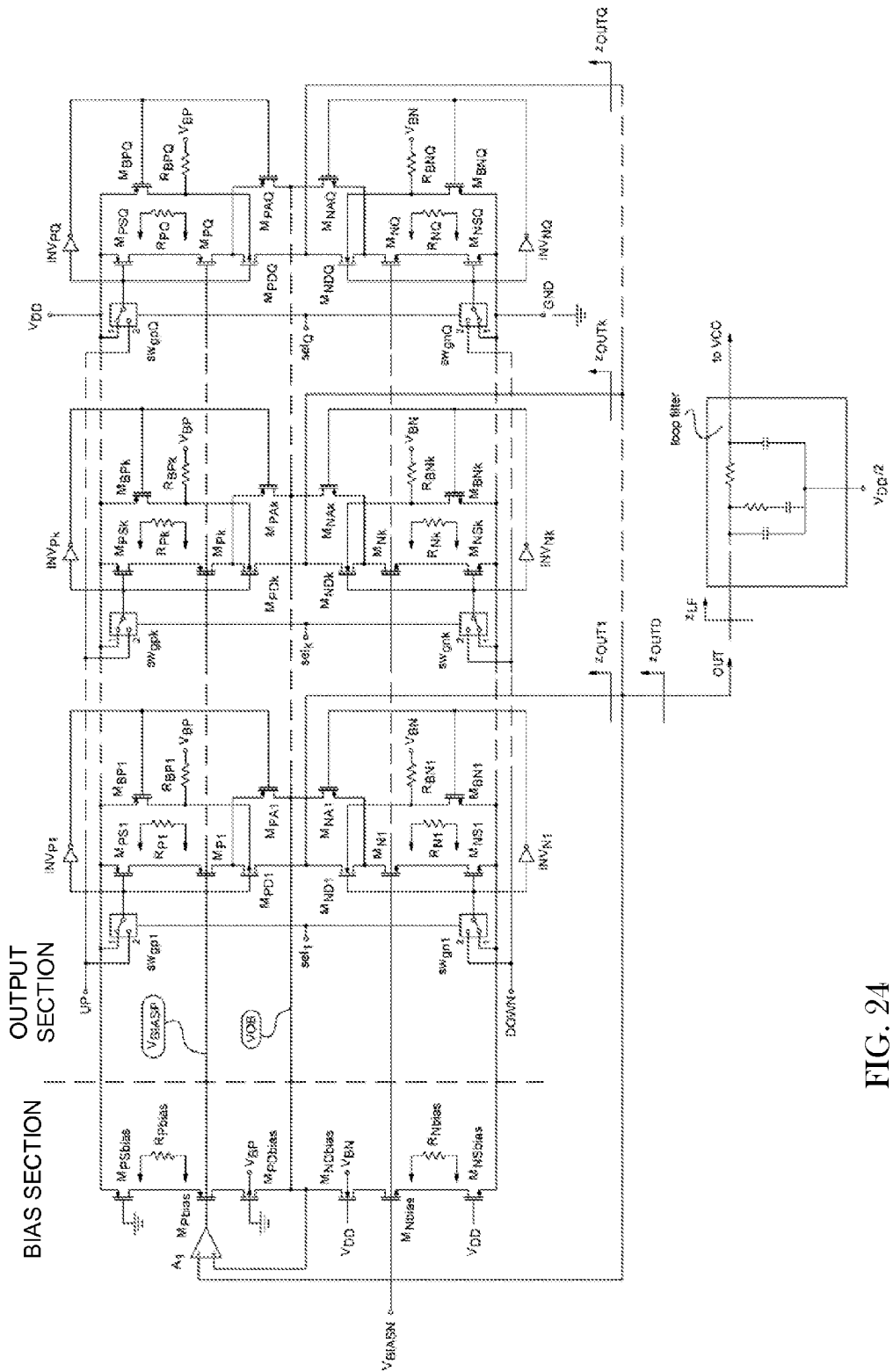
FIG. 24 illustrates generally an example of a programmable charge pump circuit with feedback-enhanced current matching and without a charge sharing buffer.

FIG. 24 illustrates generally an example of a programmable charge pump circuit with a bias section and an output section with improved output impedance. The example of FIG. 24 is similar to the circuit of FIG. 23, with the exception of the unity-gain buffer circuit BUF being replaced in FIG. 24 with a connection to the drains of transistors $M_{NDbias}$ and $M_{PDbias}$. In the example of FIG. 24, the voltages on nodes VOB and OUT are substantially equal, no additional circuitry is required for a unity-gain buffer circuit, and charge sharing is substantially minimized or prevented.

Figure 25:
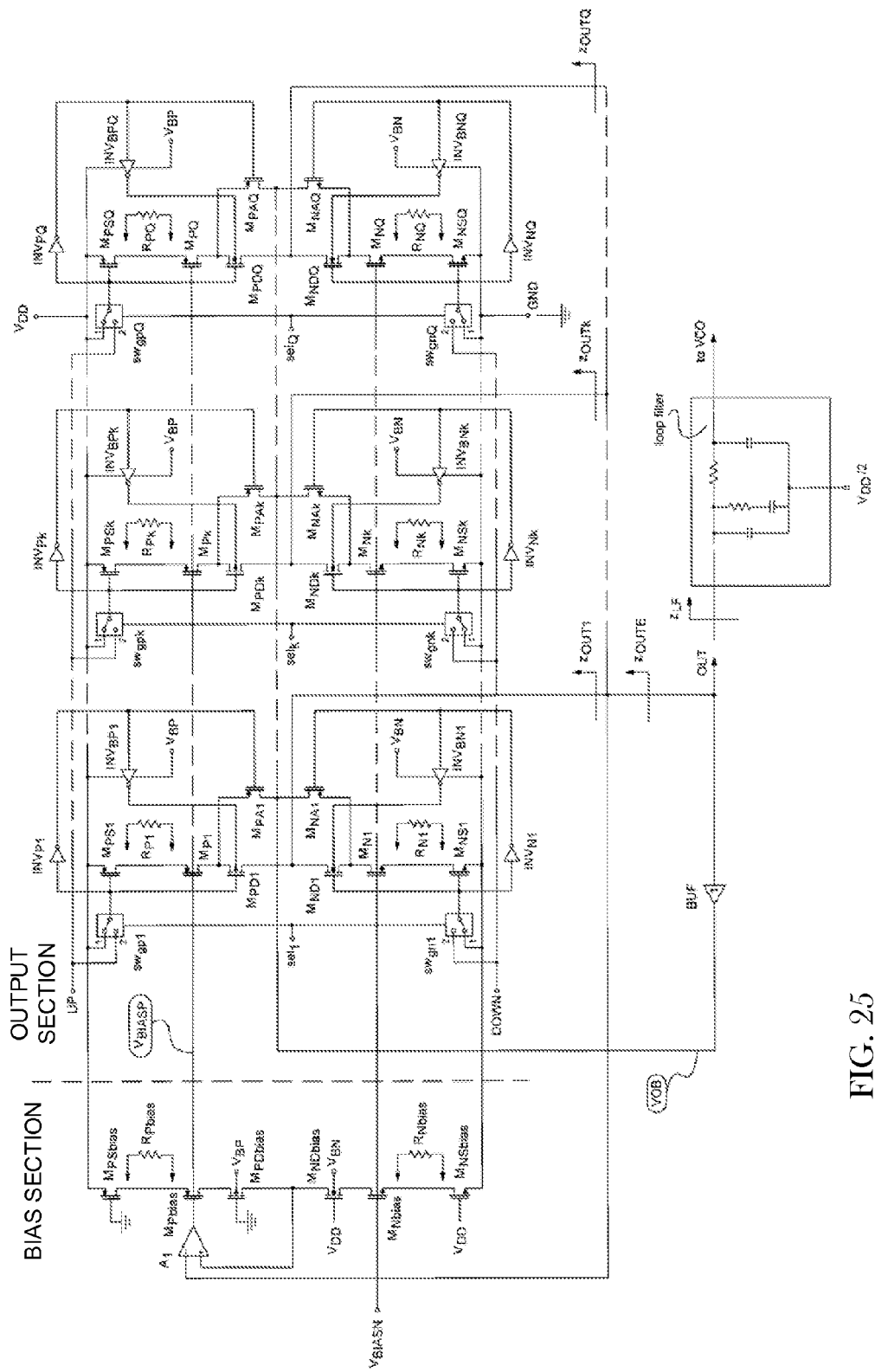
FIG. 25 illustrates generally an example of a programmable charge pump circuit with feedback-enhanced current matching and a buffer for reducing charge sharing.

FIG. 25 illustrates generally an example of a programmable charge pump circuit with a bias section and an output section with improved output impedance. With the exception of individual unity-gain buffer circuits, the example of FIG. 25 uses a full complementary charge pump output stage corresponding to the example of FIG. 18 as a building block of each of its multiple charge pump output stages in the output section. In the example of FIG. 25, one unity-gain buffer circuit BUF is used to inhibit or prevent charge sharing between the charge pump circuit's switching devices and the output node. Relative to the example of FIG. 21, the example of FIG. 25 can include additional inverters $I_{NVBNk}$ and $I_{NVBPk}$, for k=1, . . . , Q, or additional body bias voltages $V_{BN}$ and $V_{BP}$, such as to increase the charge pump circuit's output impedance when any one or more of the output stages in the output section is in an OFF state. The bias stage of the charge pump circuit of FIG. 25 includes appropriately scaled devices $M_{NDbias}$ and $M_{PDbias}$. The body nodes of devices $M_{NDbias}$ and $M_{PDbias}$ can be coupled to voltages $V_{BN}$ and $V_{BP}$, respectively.

Figure 26:
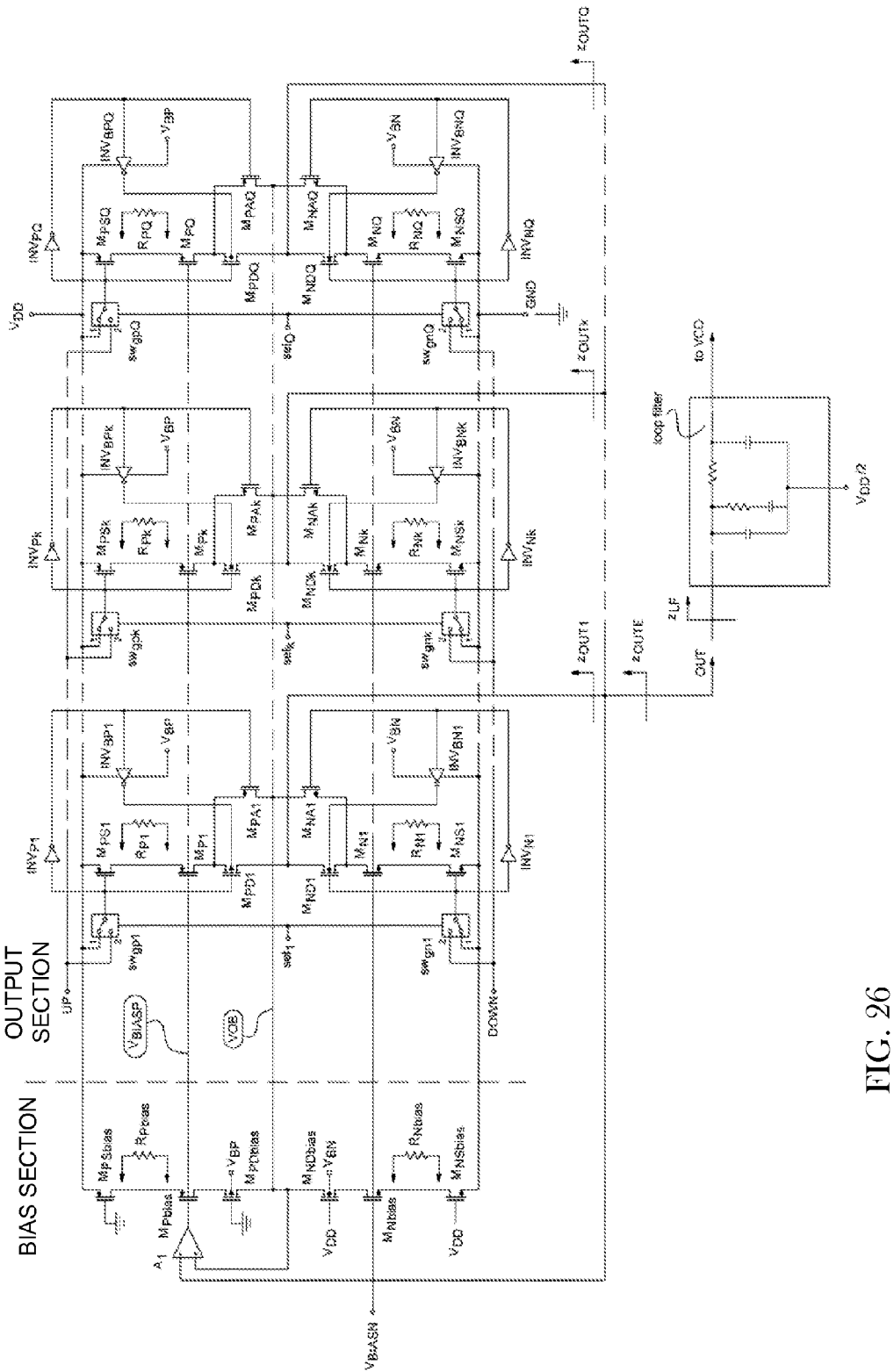
FIG. 26 illustrates generally an example of a programmable charge pump circuit with feedback-enhanced current matching and without a charge sharing buffer.

FIG. 26 illustrates generally an example of a programmable charge pump circuit with a bias section and an output section with improved output impedance. The example of FIG. 26 is similar to the example of FIG. 25, with an exception of the unity-gain buffer circuit BUF being replaced in FIG. 26 with a connection to the drains of transistors $M_{NDbias}$ and $M_{PDbias}$. In the example of FIG. 26, the voltages at nodes VOB and OUT can be substantially equal, no additional circuitry is required for a unity-gain buffer circuit, and charge sharing is substantially minimized or prevented.

Figure 27:
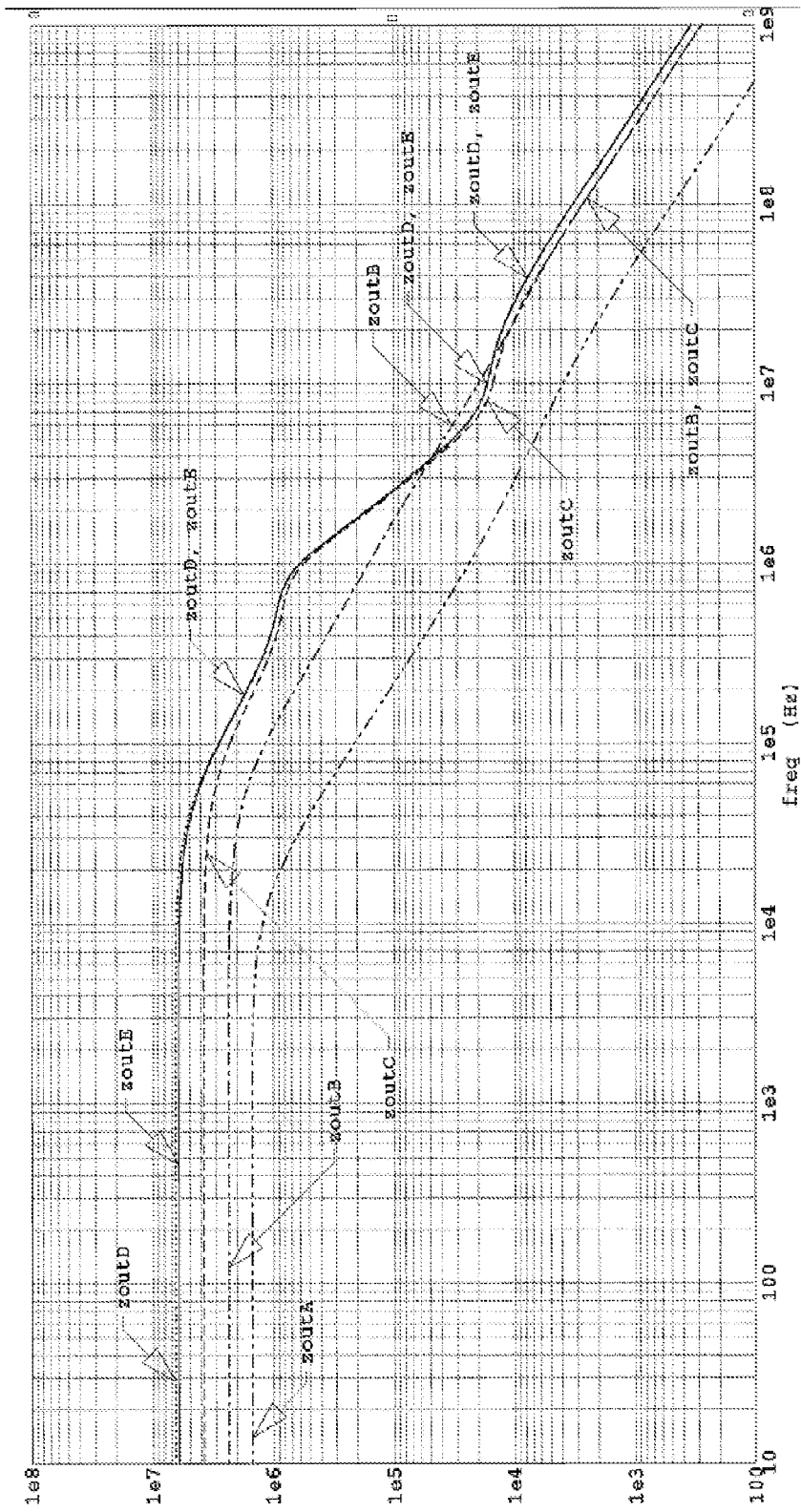
FIG. 27 illustrates generally an example of a simulation result showing small-signal output impedances of the charge pump circuits of FIGS. 19, 20, 22, 24, and 26.
Figure 28:
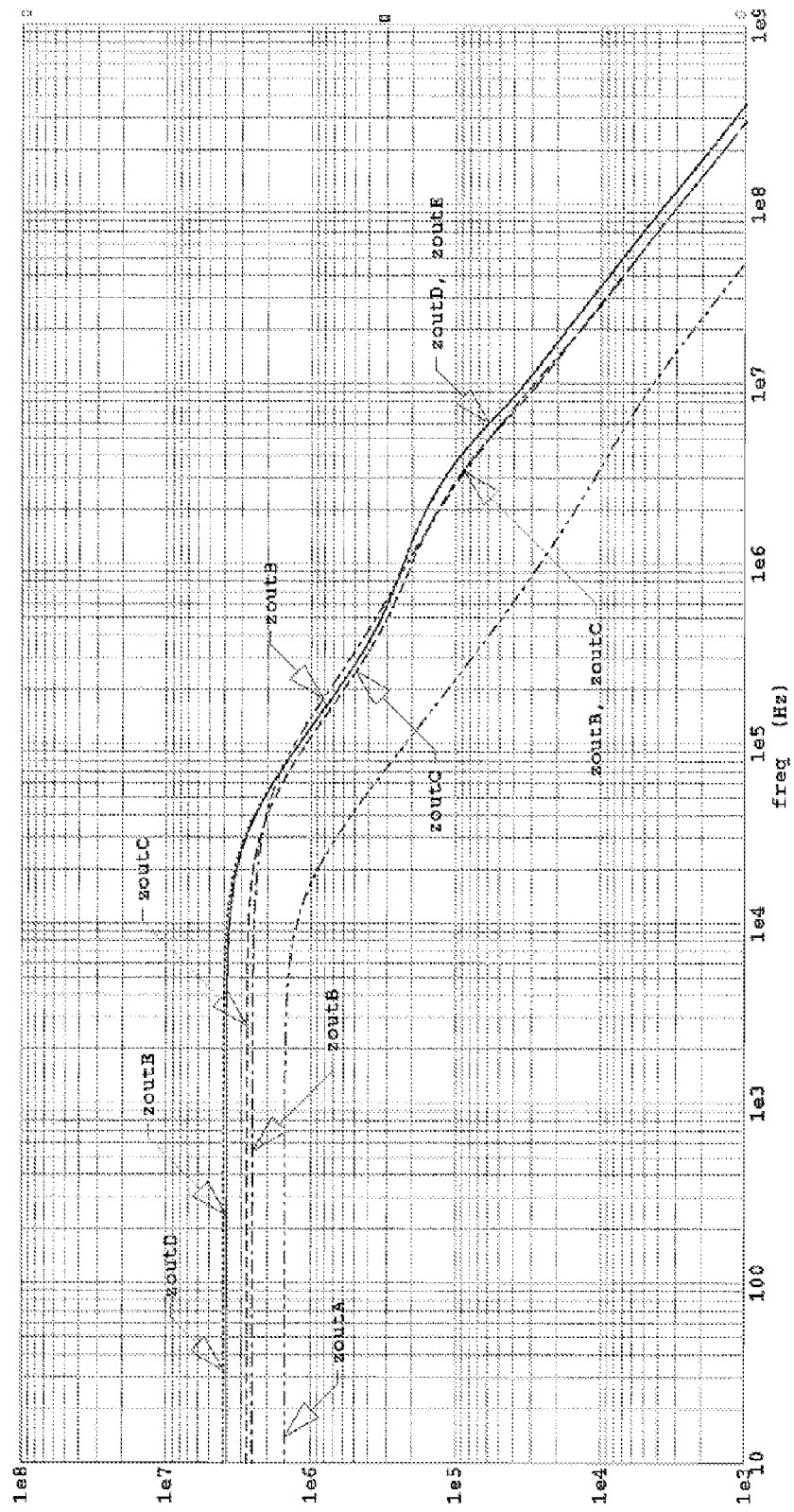
FIG. 28 illustrates generally an example of a simulation result showing small-signal output impedances of the charge pump circuits of FIGS. 19, 20, 22, 24, and 26.

FIGS. 27 and 28 illustrate generally plots showing output impedance characteristic information for each of the circuits of FIGS. 19, 20, 22, 24, 26 (corresponding to output impedances $z_{OUTA}$, $z_{OUTB}$, $z_{OUTC}$, $z_{OUTD}$, and $z_{OUTE}$, respectively), for a total of Q=64 identical output stages, such as when only one of the output stages is selected (e.g., $sel_1$="1", $sel_k$="0", for k=2, Q). In the example of FIG. 27, both sinking and sourcing portions of the selected output stage are on, that is, UP="0" and DOWN="1". In the example of FIG. 28, both sinking and sourcing portions of the selected output stage are off, that is, UP="1", and DOWN="0". In an example, because of the feedback action of operational amplifier $A_1$, the output impedance is higher when both sinking and sourcing sections are on, as compared to any one-sided impedance (i.e., when only one of the sinking or the sourcing portion of the output stage is on), and the output impedance is comparable to the output impedance in the OFF state.

FIGS. 29-38 illustrate generally examples of circuit simulation results, such as corresponding to the circuits of FIGS. 19-28, and including time-domain plots for various internal and external current pulses. As used herein, an "internal current" pulse refers to a difference between drain currents of the pullup and pulldown switches in any output stage of a charge pump circuit. For example, an "internal current" pulse can refer to a difference between the drain currents of transistors $M_{P1}$ and $M_{N1}$, such as in the example of FIG. 20. An "external current" pulse refers to a current pulse at the output node of the charge pump circuit.

Figure 29:
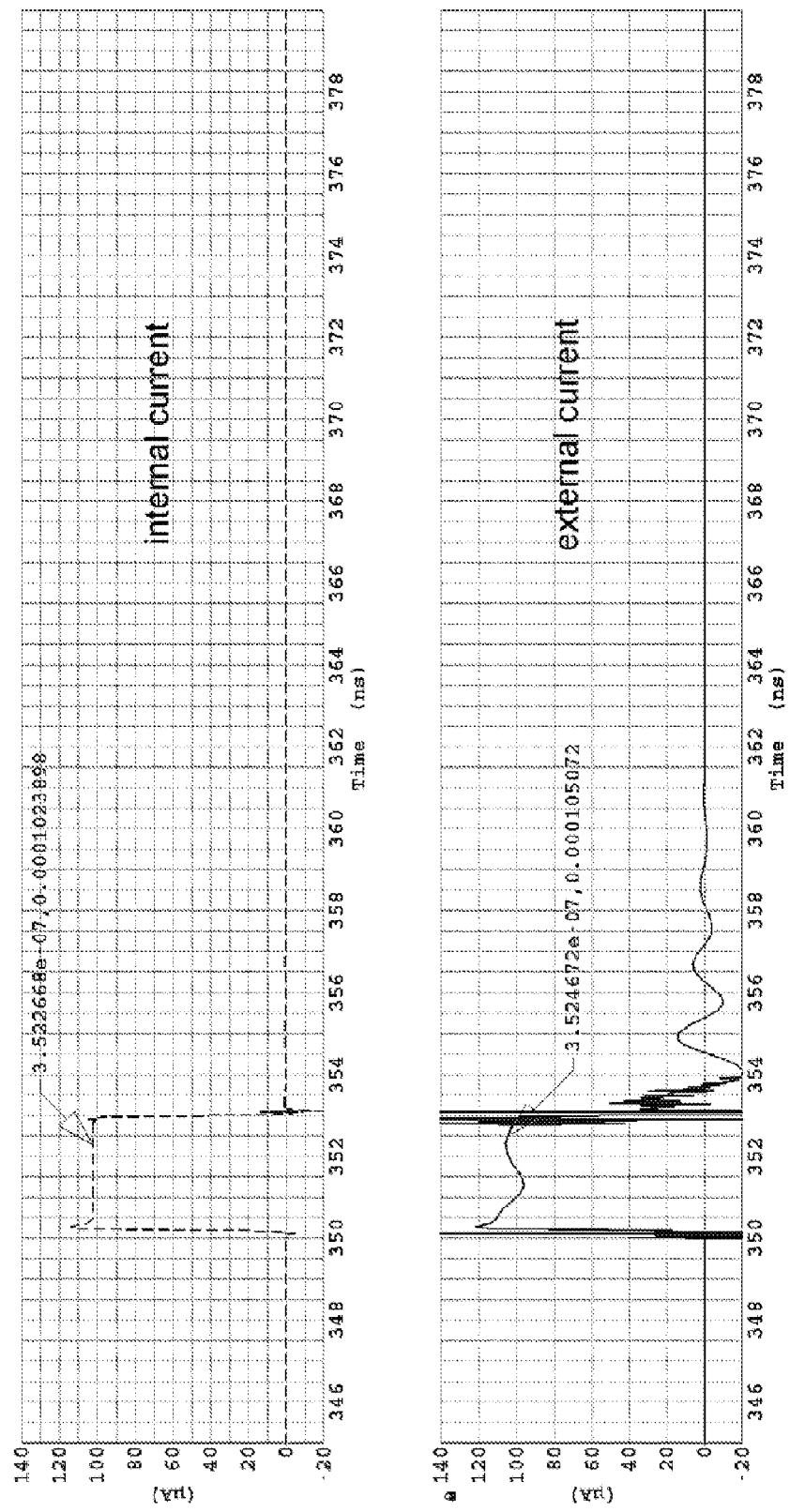
FIG. 29 illustrates generally an example of a simulation result showing a time-domain plot of internal and external current pulses corresponding to FIG. 19.

FIG. 29 illustrates generally an example of a time-domain plot of an internal current pulse and an external current pulse of the charge pump circuit of FIG. 19, with Q=64 substantially identical output stages, a 100 µA programmed current, $sel_1$=1, $sel_2$, . . . , $sel_{64}$=0, 2.77 ns pulse width, and an ideal loop filter impedance (e.g., $z_{LF}$=0), in a simulated but realistic operating environment containing parasitic inductances for the ground and supply connections. Despite unwanted ringing and overshoot, the output current pulse delivered to the ideal load (e.g., the loop filter circuit) has the expected value of about 100 µA.

Figure 30:
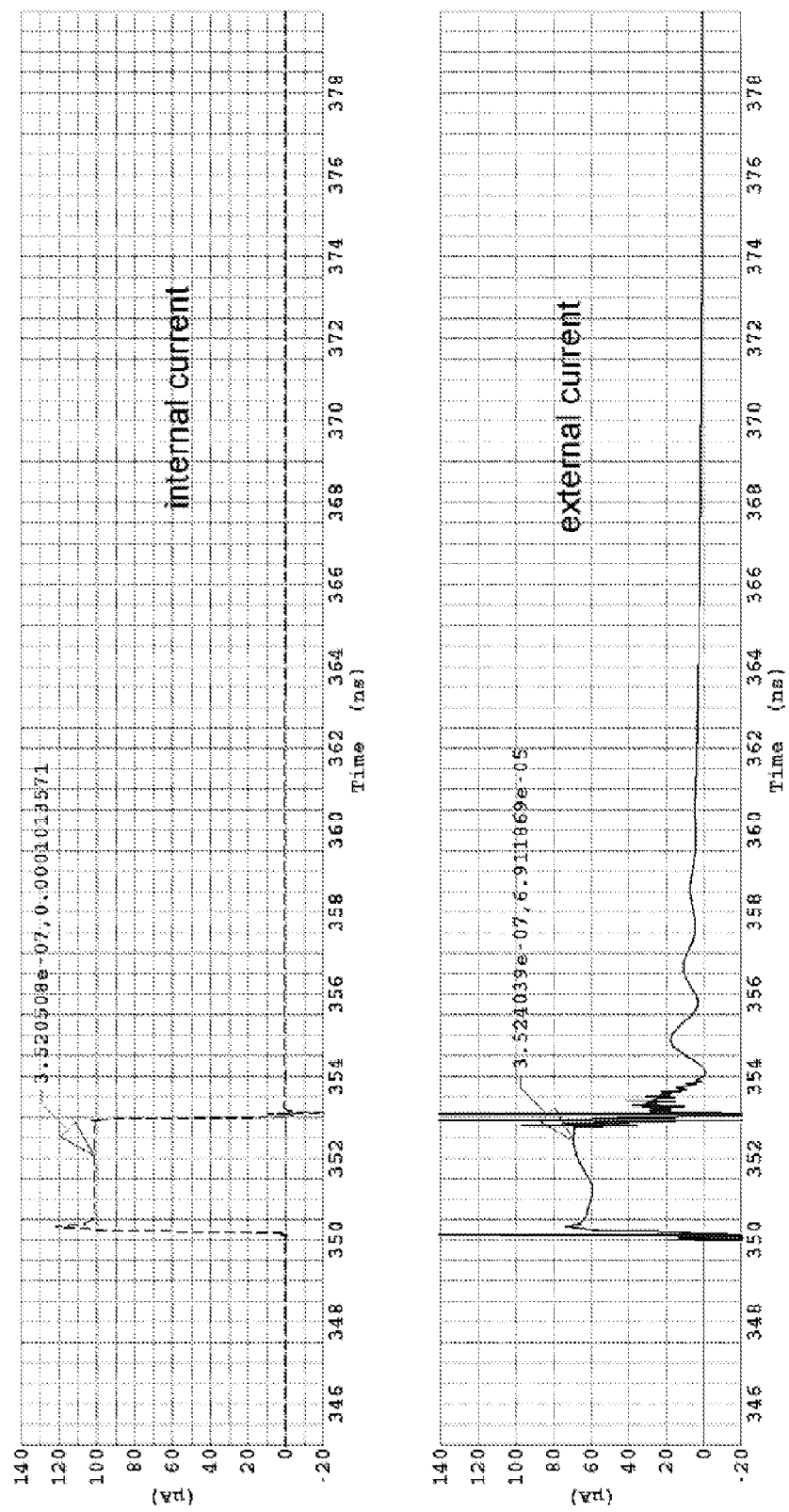
FIG. 30 illustrates generally an example of a simulation result showing a time-domain plot of internal and external current pulses corresponding to FIG. 19.
Figure 31:
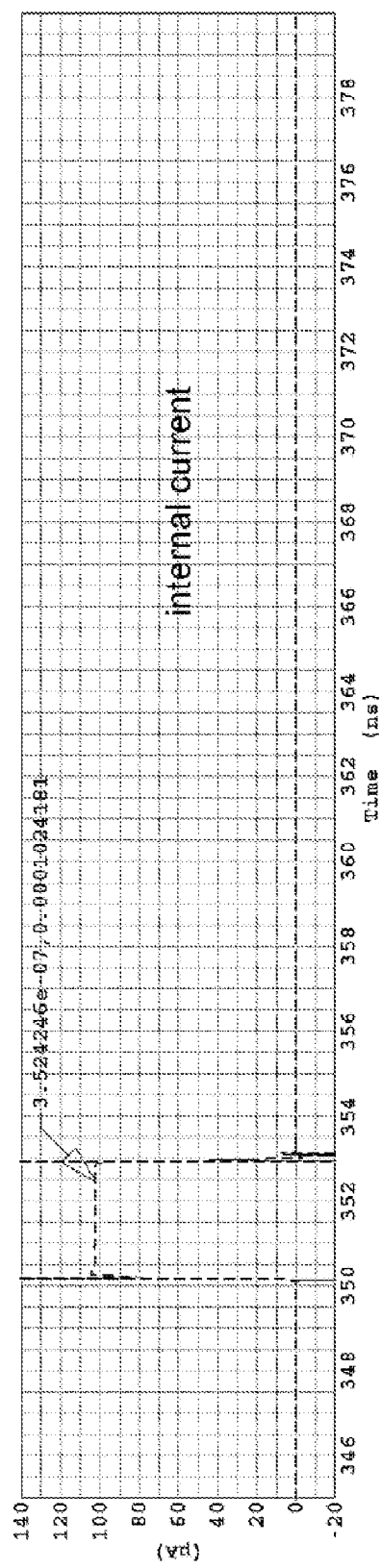
FIG. 31 illustrates generally an example of a simulation result showing a time-domain plot of internal and external current pulses corresponding to FIG. 20.
Figure 31:
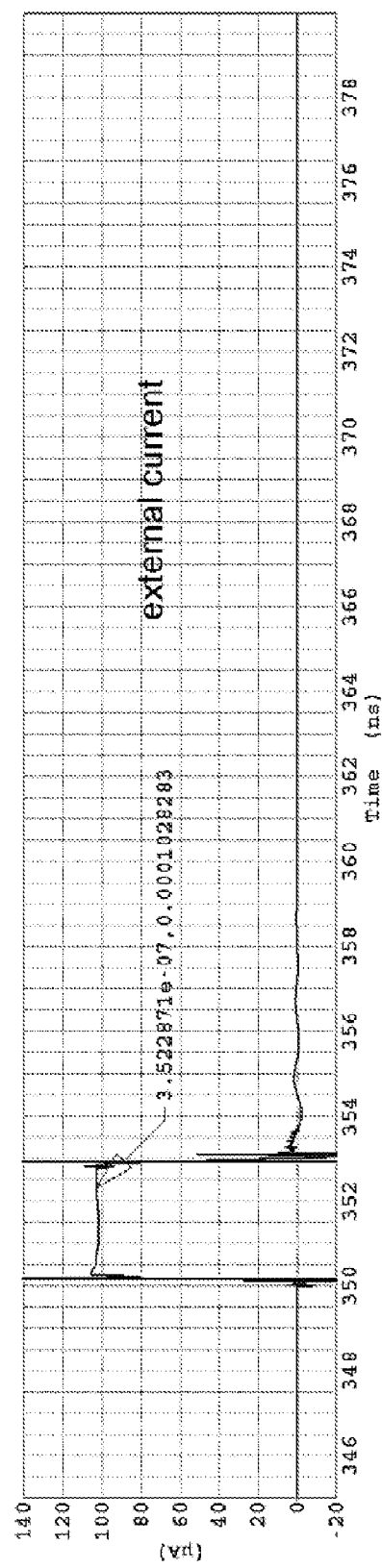
Figure 32:
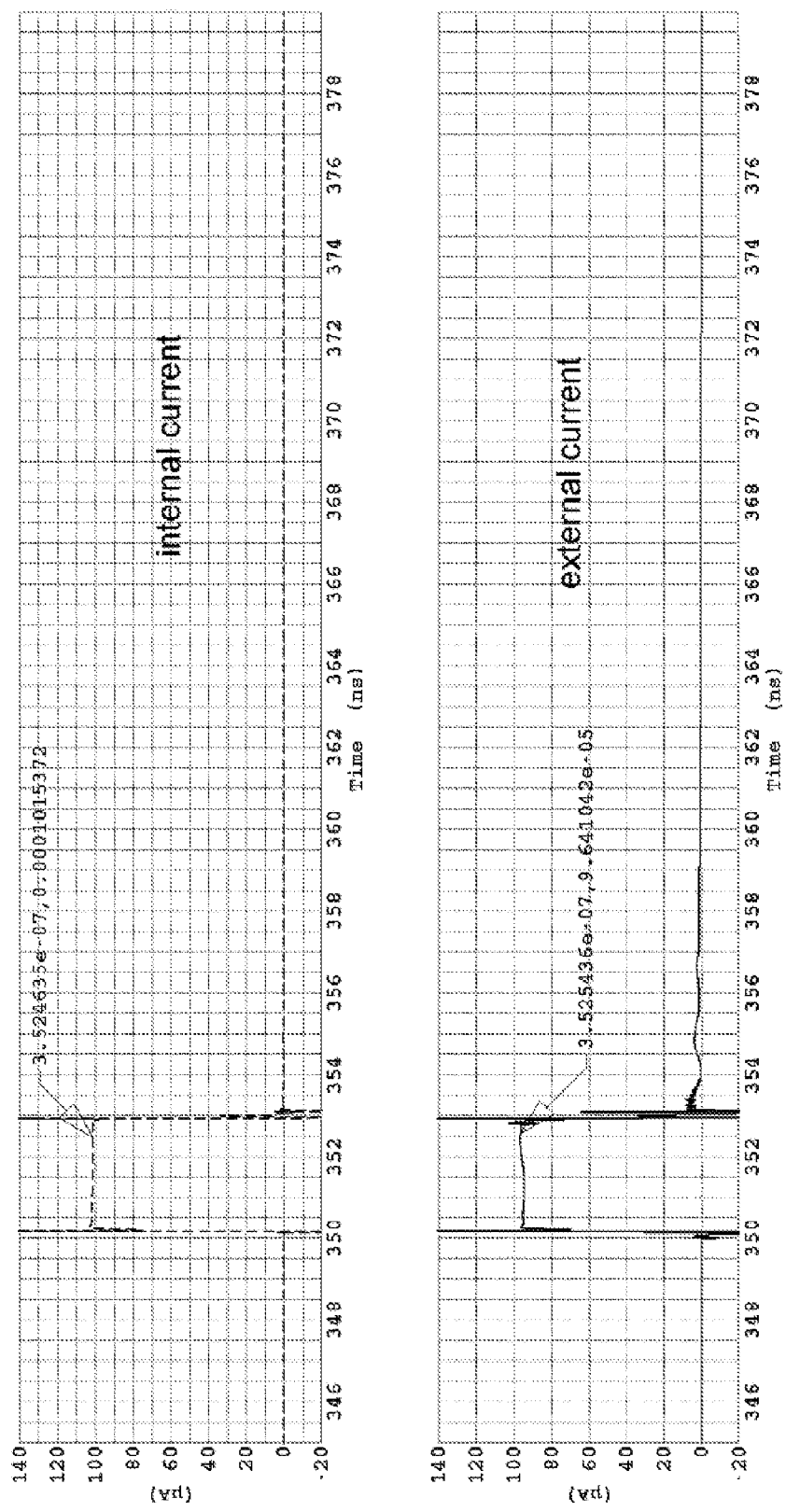
FIG. 32 illustrates generally an example of a simulation result showing a time-domain plot of internal and external current pulses corresponding to FIG. 20.
Figure 33:
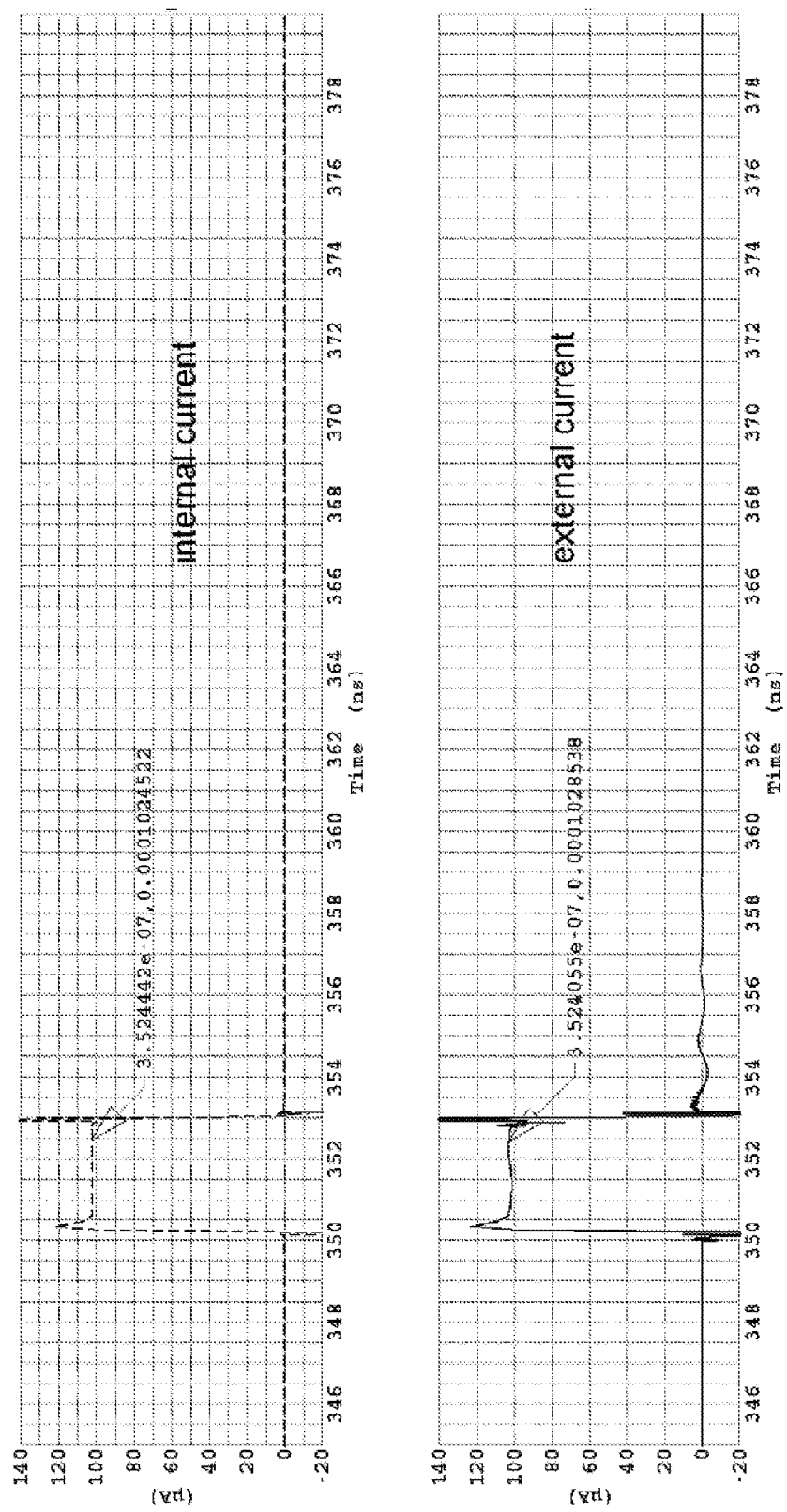
FIG. 33 illustrates generally an example of a simulation result showing a time-domain plot of internal and external current pulses corresponding to FIG. 22.
Figure 34:
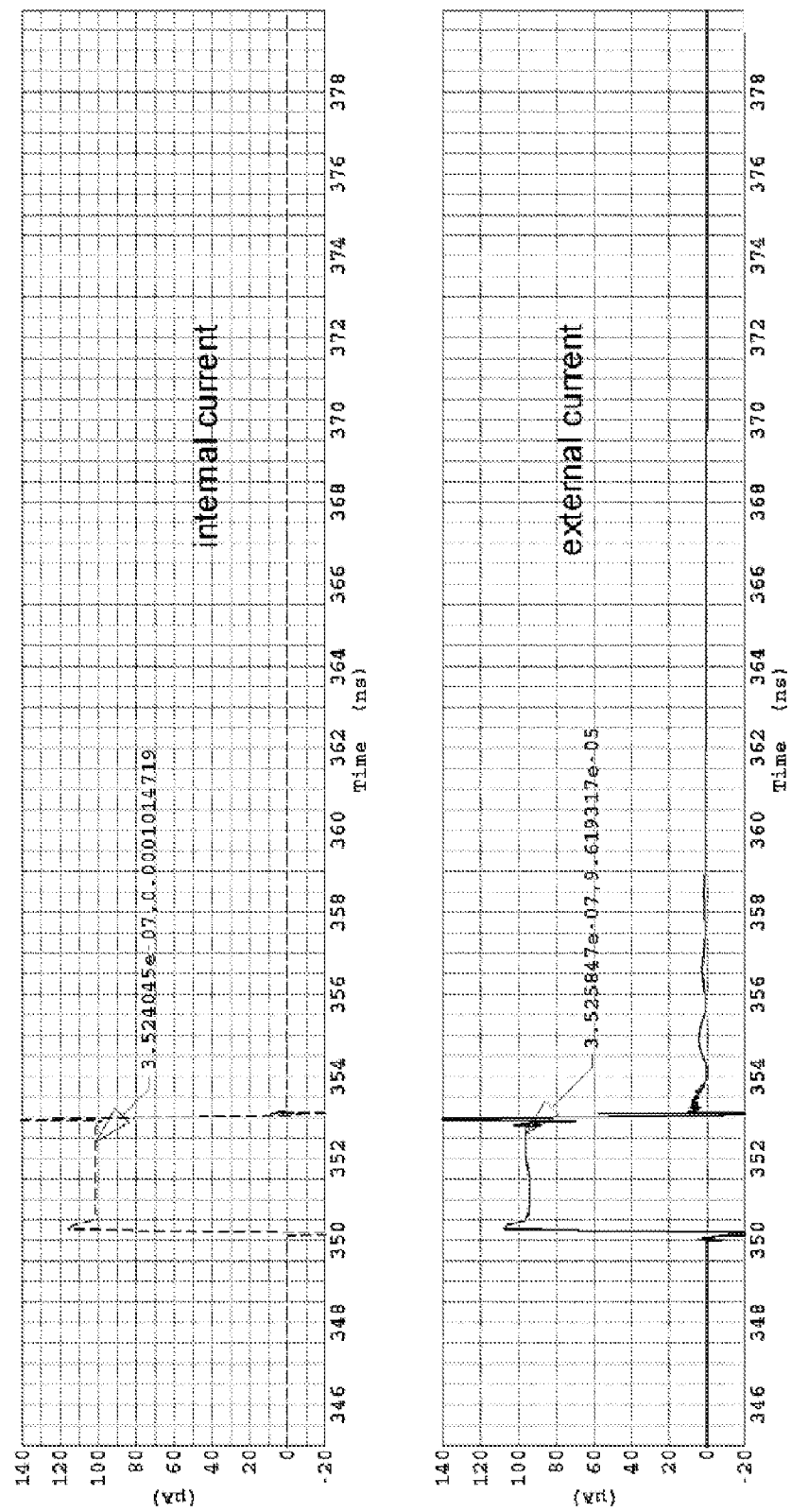
FIG. 34 illustrates generally an example of a simulation result showing a time-domain plot of internal and external current pulses corresponding to FIG. 22.
Figure 35:
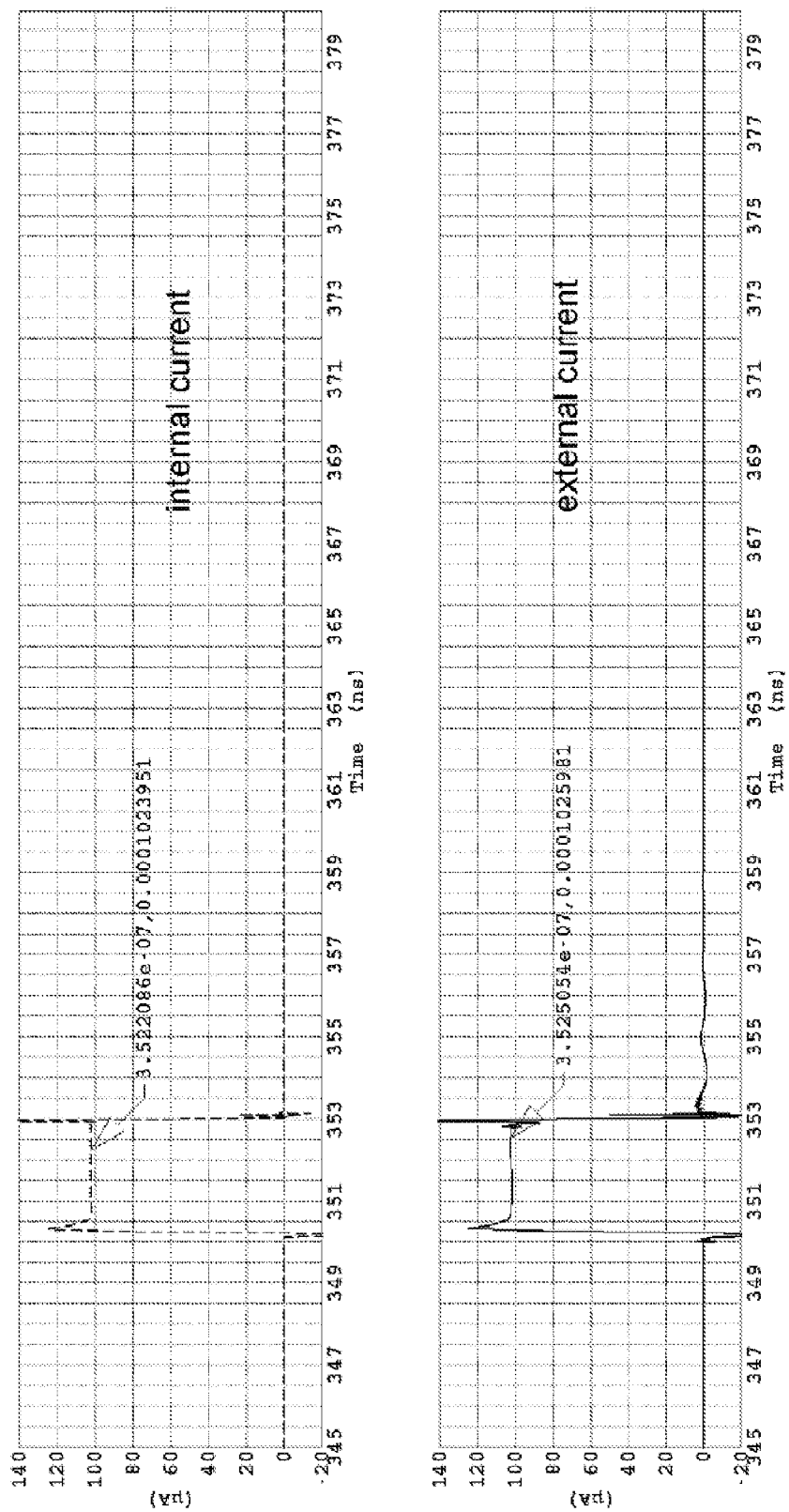
FIG. 35 illustrates generally an example of a simulation result showing a time-domain plot of internal and external current pulses corresponding to FIG. 24.
Figure 36:
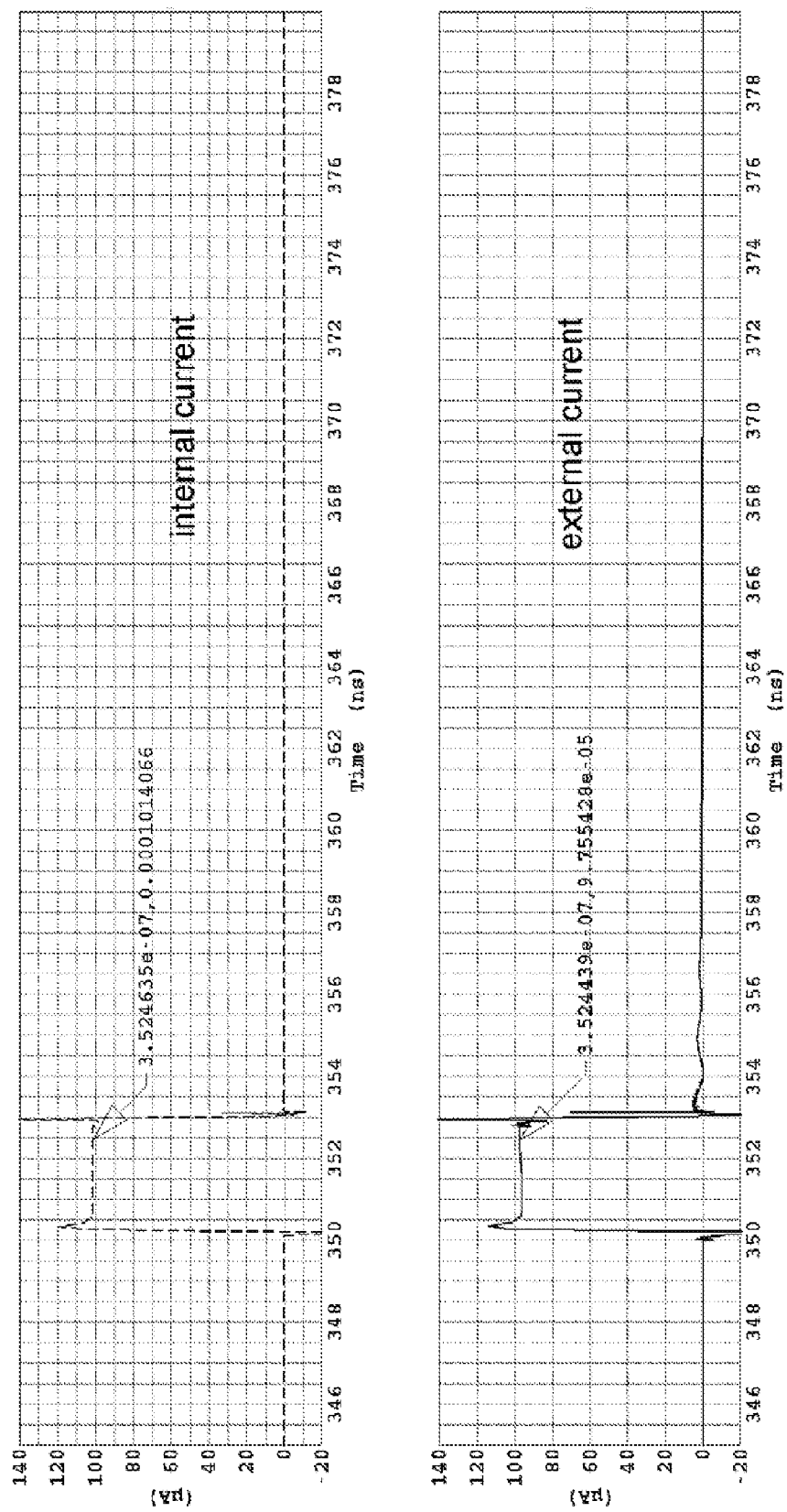
FIG. 36 illustrates generally an example of a simulation result showing a time-domain plot of internal and external current pulses corresponding to FIG. 24.
Figure 37:
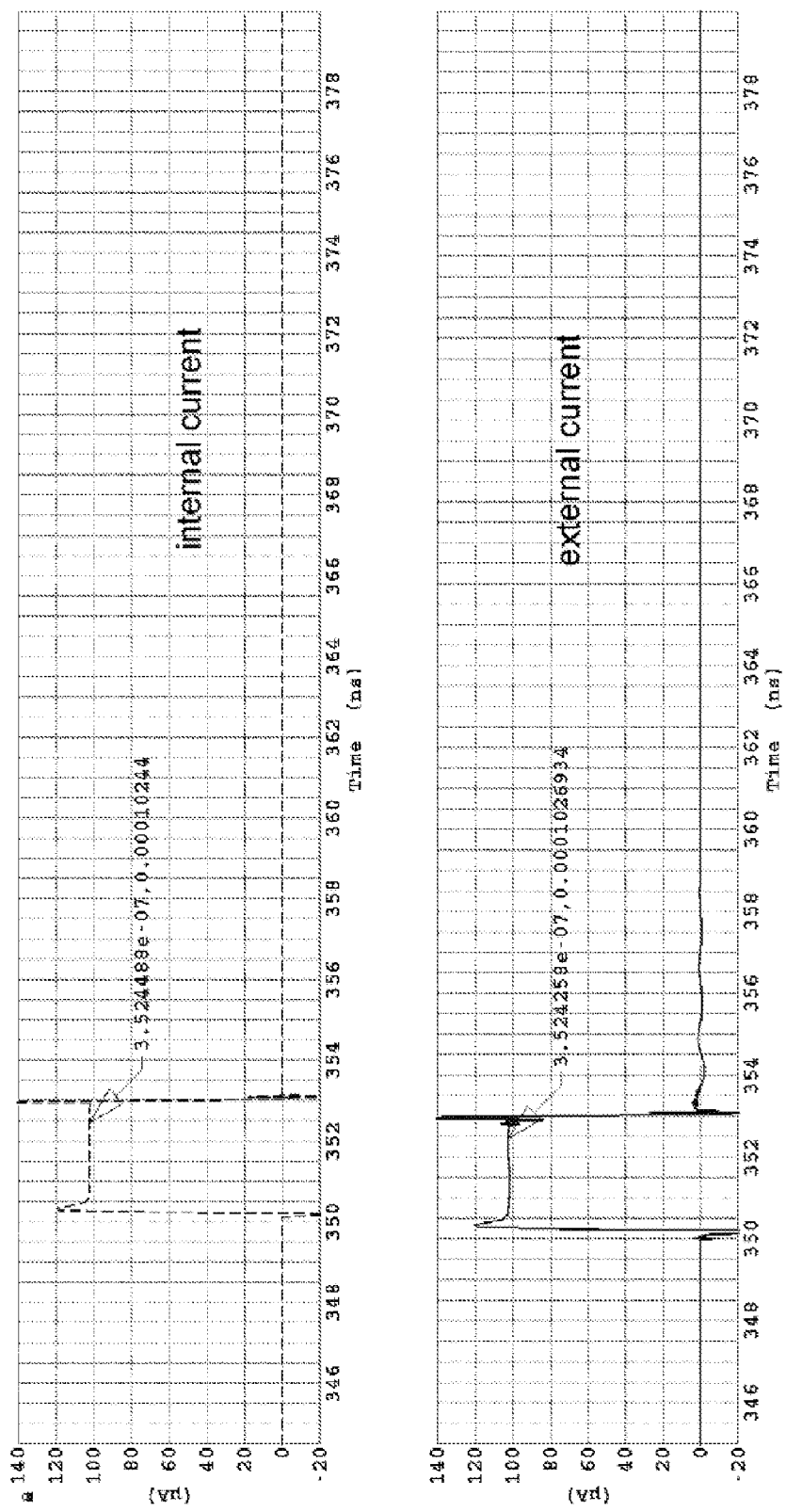
FIG. 37 illustrates generally an example of a simulation result showing a time-domain plot of internal and external current pulses corresponding to FIG. 26.
Figure 38:
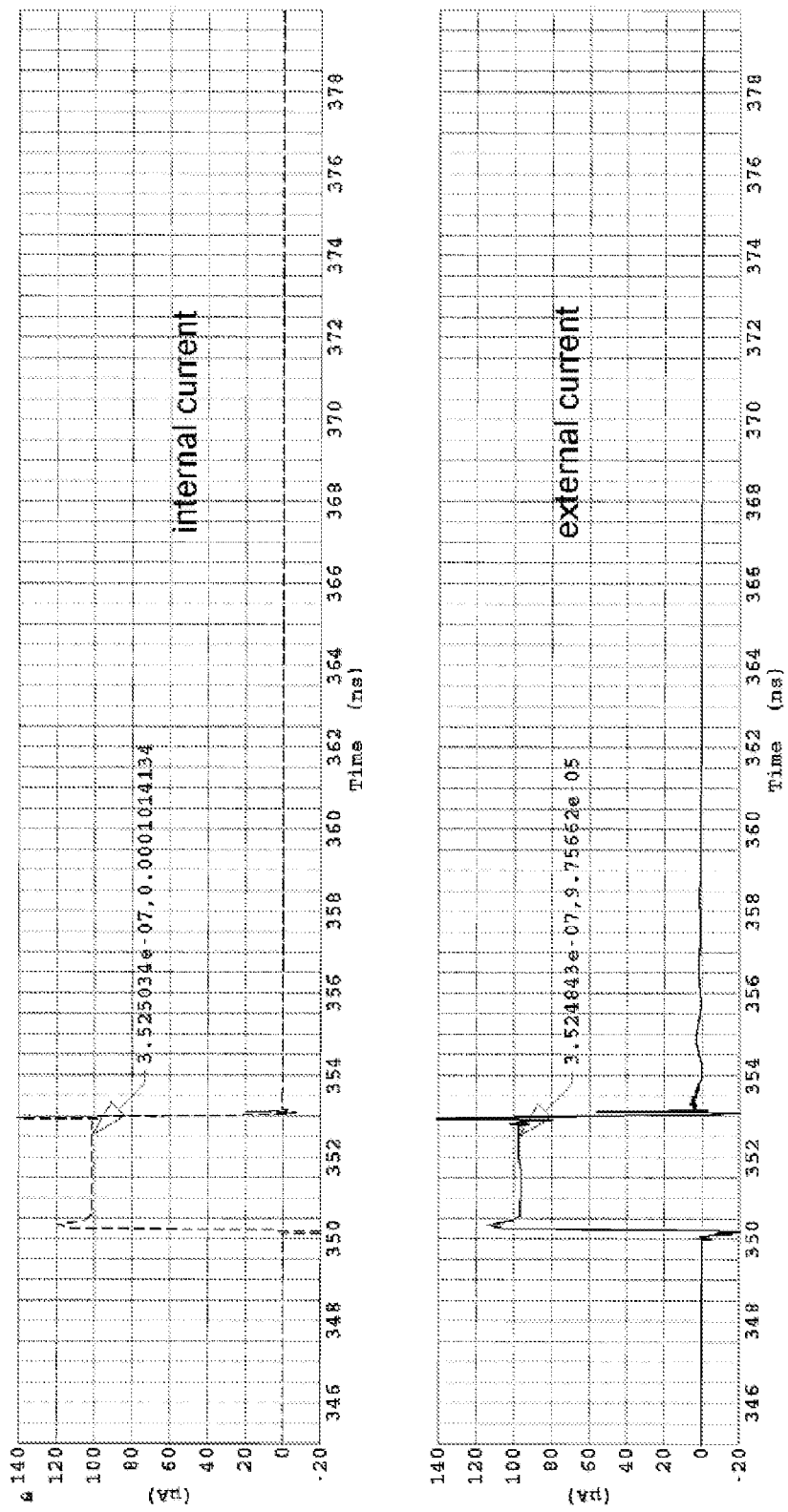
FIG. 38 illustrates generally an example of a simulation result showing a time-domain plot of internal and external current pulses corresponding to FIG. 26.

FIG. 30 illustrates generally an example of a time-domain plot of an internal current pulse and an external current pulse of the charge pump circuit of FIG. 19, with Q=64 substantially identical output stages, a 100 µA programmed current, $sel_1$=1, $sel_2$, . . . , $sel_{64}$=0, 2.77 ns pulse width, and a more realistic loop filter impedance (e.g., $z_{LF}$=1 kΩ||4 pF), such as in the same operating environment as in FIG. 29, including parasitic inductances for the ground and supply connections. In the example of FIG. 30, in addition to the unwanted ringing and overshoot, because of the realistic load which appears in parallel with the relatively low output impedance of the charge pump circuit of FIG. 19, there can be a substantial reduction in the amplitude of the external current pulse delivered to the loop filter.

FIGS. 31, 33, 35, and 37 illustrate generally examples of time-domain plots of internal and external current pulses corresponding to the programmable charge pump circuits of FIGS. 20, 22, 24, and 26, respectively, such as with Q=64 substantially identical output stages, a 100 µA programmed current, $sel_1$=1, $sel_2$, . . . , $sel_{64}$=0, 2.77 ns pulse width, and an ideal loop filter impedance (e.g., $z_{LF}$=0), such as in the same operating environment as in FIG. 29. Because of the higher charge pump circuit output impedance, substantially less ringing and overshoot are observed relative to the example of FIG. 29.

FIGS. 32, 34, 36, and 38 illustrate generally examples of time-domain plots of internal and external current pulses corresponding to the programmable charge pump circuits of FIGS. 20, 22, 24, and 26, respectively, such as with Q=64 substantially identical output stages, a 100 µA programmed current, $sel_1$=1, $sel_2$, . . . , $sel_{64}$=0, 2.77 ns pulse width, and with the same realistic loop filter impedance ($z_{LF}$=1 kΩ||4 pF) as in FIG. 30, and in the same operating environment containing parasitic inductances for the ground and supply connections as used in FIG. 29. Because of the higher charge pump circuit output impedances, the amplitude of the current pulse delivered to the loop filter circuit more closely retains its programmed value of 100 µA, and substantially less ringing and overshoot are observed relative to the example of FIG. 30.

VARIOUS NOTES & EXAMPLES

Example 1 can include or use subject matter such as an apparatus, a method, a means for performing acts, or a device readable medium including instructions that, when performed by the device, can cause the device to perform acts, such as can include or an apparatus that includes a charge pump circuit. The charge pump circuit of Example 1 can include a pump stage configured to at least one of source or sink current to an output node of the pump stage. In Example 1, the pump stage includes at least one of a pullup field-effect transistor (FET) or a pulldown FET. The pullup field-effect transistor (FET) can include a drain, a source, and a gate, and the drain and source can be concurrently switched by separate switches respectively associated with the drain and source to switch the pullup FET between current conducting and non-conducting states with respect to the output node of the pump stage. The pulldown FET can include a drain, a source, and a gate, and the drain and source can be concurrently switched by separate switches respectively associated with the drain and source to switch the pulldown FET between current conducting and non-conducting states with respect to the output node of the pump stage.

Example 2 can include, or can optionally be combined with the subject matter of Example 1, to optionally include, in the pump stage, both of the pullup FET and the pulldown FET, each concurrently switched by separate switches included in the pump stage and respectively associated with the drain and the source of the respective pullup FET or pulldown FET.

Example 3 can include, or can optionally be combined with the subject matter of one or any combination of Examples 1 or 2 to optionally include a first bias switch in the pump stage, and the first bias switch can be coupled to a drain node of at least one of the pullup FET or the pulldown FET. In Example 3, the drain node of the at least one of the pullup FET or the pulldown FET can be cyclically switched by the first bias switch to establish a selected bias voltage at the drain node of the at least one of the pullup FET or the pulldown FET when it is in a non-conducting state.

Example 4 can include, or can optionally be combined with the subject matter of one or any combination of Examples 1 through 3 to optionally include a second bias switch in the pump stage. The second bias switch can be coupled to a body node of at least one of the pullup FET or the pulldown FET, and the body node of the at least one of the pullup FET or the pulldown FET can be cyclically switched by the second bias switch to establish a selected bias voltage at the body node of the at least one of the pullup FET or the pulldown FET when the at least one of the pullup FET or the pulldown FET is in a conducting state to at least reduce a body effect.

Example 5 can include, or can optionally be combined with the subject matter of one or any combination of Examples 1 through 3 to optionally include an inverter circuit configured to monitor a status of the at least one of the pullup FET or the pulldown FET and, when the at least one of the pullup FET or the pulldown FET is in a conducting state, the inverter circuit is configured to provide a signal to a body node of the at least one of the pullup FET or the pulldown FET to establish a bias voltage at the body node to reduce a body effect.

Example 6 can include, or can optionally be combined with the subject matter of one or any combination of Examples 1 through 5 to optionally include multiple instances of the pump stage. In Example 6, in a first instance of the pump stage, the drain and source of at least one of the pullup FET or the pulldown FET can be switched into and held in a non-conducting state by the separate switches associated with the at least one of the pullup FET or the pulldown FET, while, in a second instance of the pump stage, at least one of the pullup FET or the pulldown FET is cyclically switched between a conducting and a non-conducting state.

Example 7 can include, or can optionally be combined with the subject matter of one or any combination of Examples 1 through 6 to optionally include a phase-locked loop circuit that includes the charge pump circuit. Example 7 can further include a loop filter coupled to the output node of the pump stage to establish a loop frequency that is based at least in part on a charge output or current output of the pump stage.

Example 8 can include, or can optionally be combined with the subject matter of one or any combination of Examples 1 through 7 to optionally include the pulldown FET and the separate switches respectively associated with the drain and source of the pulldown FET. In Example 8, the separate switches include a first switch coupled between the drain of the pulldown FET and the output node of the pump stage, and a second switch coupled between the source of the pulldown FET and a reference node. In Example 8, the first and second switches can include respective switch control nodes that are electrically coupled together, wherein the first and second switches switch between conducting and non-conducting states based on a signal at the switch control nodes.

Example 9 can include, or can optionally be combined with the subject matter of Example 8, to optionally include a first resistor coupled between the source of the pulldown FET and the second switch.

Example 10 can include, or can optionally be combined with the subject matter of one or any combination of Examples 8 or 9 to optionally include the first and second switches are FETs, and wherein both of a width and a length characteristic of the first switch are selected to be smaller than both of a width and a length characteristic of the pulldown FET to minimize an effect of the first switch on an output impedance at the output node of the pump stage.

Example 11 can include, or can optionally be combined with the subject matter of one or any combination of Examples 1 through 10 to optionally include a bias stage that includes a first switch sized and arranged to mirror a first one of the separate switches associated with the at least one of the pullup FET or the pulldown FET, and a second switch sized and arranged to mirror a second one of the separate switches associated with the at least one of the pullup FET or the pulldown FET. In Example 11, the bias stage can be configured to provide a first bias voltage to the gate of the at least one of the pullup FET or the pulldown FET, and the first bias voltage can be based on a voltage at the output node of the pump stage.

Example 12 can include, or can optionally be combined with the subject matter of one or any combination of Examples 1 through 11 to optionally include both of the pullup FET and the pulldown FET, each concurrently switched by separate switches respectively associated with the drain and the source of the respective pullup FET or pulldown FET, and a bias stage that includes (1) a first switch sized and arranged to mirror the one of the separate switches associated with the drain of the pullup FET, and (2) a second switch sized and arranged to mirror the one of the separate switches associated with the drain of the pulldown FET. In Example 12, the bias stage can be configured to provide a first bias voltage to the gate of the pullup FET and a second bias voltage to a gate of the pulldown FET, and at least one of the first and second bias voltages can be based on a voltage at the output node of the pump stage.

Example 13 can include, or can optionally be combined with the subject matter of Example 12, to optionally include a first FET as the first switch, and a gate of the first FET can be coupled together to a DC reference node. Example 13 can include a second FET as the second switch, and a gate of the second FET can be coupled together to a DC source voltage signal. In Example 13, the first and second FETs can be biased into a conducting state.

Example 14 can include, or can optionally be combined with the subject matter of one or any combination of Examples 12 or 13, to optionally include the respective drain nodes of the pullup FET and the pulldown FET being cyclically switched by respective additional separate switches to establish a selected bias voltage at the respective drain nodes when the pullup FET and the pulldown FET are each in a non-conducting state.

Example 15 can include, or can optionally be combined with the subject matter of one or any combination of Examples 12 through 14 to optionally include a unity gain buffer circuit coupled between the output node of the pump stage and the drain nodes of the pullup FET and the pulldown FET via the respective additional separate switches.

Example 16 can include, or can optionally be combined with the subject matter of Example 15, to optionally include the selected bias voltage being provided by the bias stage and following a voltage at the output node of the pump stage.

Example 17 can include, or can optionally be combined with the subject matter of one or any combination of Examples 1 through 16 to include, subject matter such as a method for enhancing an output impedance of a programmable charge pump circuit having multiple pump stages, each of the pump stages having both a pullup field-effect transistor (FET) and a pulldown FET coupled to a shared charge pump output node. The method of Example 17 can include identifying a first unused pump stage from the multiple pump stages in the charge pump circuit, and, in the first unused pump stage (1) using a first switch, decoupling a source node of a first pullup FET from a supply rail of the first unused pump stage, (2) using a second switch, decoupling a drain node of the first pullup FET from the charge pump output node, (3) using a third switch, decoupling a source node of a first pulldown FET from a reference node of the first unused pump stage, and (4) using a fourth switch, decoupling a drain node of the first pulldown FET from the charge pump output node.

Example 18 can include, or can optionally be combined with the subject matter of one or any combination of Examples 1 through 17 to include, subject matter such as a method for providing an oscillating output voltage using a voltage controlled oscillator of a phase-locked loop circuit, the phase-locked loop circuit including a programmable charge pump having a bias stage and an output stage. Example 18 can include detecting a difference between a reference clock signal and a feedback signal based on the oscillating output voltage, and generating a digital signal based on the detected difference between the reference clock signal and the feedback signal. Example 18 can include selecting for use at least one pump stage of the charge pump, the pump stage including a first pullup field-effect transistor (FET) and a first pulldown FET coupled at an output node of the charge pump. In Example 18, and in response to the digital signal generated based on the detected difference between the reference clock signal and the feedback signal, the method can include selectively decoupling at least one of the first pullup FET and the first pulldown FET from the pump stage using separate switches that are respectively associated with a drain and a source of the first pullup FET or the first pulldown FET.

Example 19 can include, or can optionally be combined with the subject matter of Example 18, to optionally include cyclically applying a selected bias voltage, using a switch, at the drain node of at least one of the first pullup FET and the first pulldown FET.

Example 20 can include, or can optionally be combined with the subject matter of one or any combination of Examples 18 or 19 to optionally include cyclically applying a selected bias voltage at a body node of at least one of the first pullup FET and the first pulldown FET to reduce a body effect.

Example 21 can include, or can optionally be combined with the subject matter of one or any combination of Examples 18 through 20 to optionally include selectively decoupling both of the first pullup FET and the first pulldown FET from the leg of the output stage using separate switches that are respectively associated with a drain of the first pullup FET, a source of the first pullup FET, a drain of the first pulldown FET, and a source of the first pulldown FET.

Example 22 can include, or can optionally be combined with the subject matter of one or any combination of Examples 1 through 21 to include, subject matter (such as an apparatus, a method, a means for performing acts, or a machine readable medium including instructions that, when performed by the machine, that can cause the machine to perform acts), such as can include a charge pump circuit for use in a phase-locked loop circuit. In Example 22, the charge pump includes a bias stage configured to receive a feedback signal based on a signal at an output node of the PLL circuit and provide a bias signal based on the received feedback signal. In Example 22, the charge pump includes at least a first pump stage configured to at least one of source or sink current to the output node of the charge pump, and the first pump stage includes a pullup field-effect transistor (FET), including a gate biased by the bias signal, a drain, and a source, wherein the drain and source are concurrently switched by first and second FET switches respectively associated with the drain and source to switch the pullup FET between current conducting and non-conducting states with respect to the output node of the charge pump. The first pump stage further includes a pulldown FET, including a gate biased by the bias signal, a drain, and a source, wherein the drain and source are concurrently switched by third and fourth FET switches respectively associated with the drain and source to switch the pulldown FET between current conducting and non-conducting states with respect to the output node of the charge pump. In Example 22, in an ON state for the first pump stage, both of the first and second FET switches switch the pullup FET into a conducting state, or both the third and fourth FET switches switch the pulldown FET into a conducting state.

Each of these non-limiting examples can stand on its own, or can be combined in various permutations or combinations with one or more of the other examples.

In the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the The claimed invention is:

1. An apparatus comprising:
   a charge pump circuit, comprising a pump stage configured to at least one of source or sink current to an output node of the pump stage when the pump stage is enabled based on a pump stage control signal, the pump stage including at least one of:
      a pullup field-effect transistor (FET), including a drain, a source, and a gate, wherein the drain and source are concurrently switched by separate switches respectively associated with the drain and source to switch the pullup FET between current conducting and non-conducting states with respect to the output node of the pump stage; or
      a pulldown FET, including a drain, a source, and a gate, wherein the drain and source are concurrently switched by separate switches respectively associated with the drain and source to switch the pulldown FET between current conducting and non-conducting states with respect to the output node of the pump stage;
   wherein in the non-conducting state, the at least one of the pullup FET or the pulldown FET is electrically isolated from the output node by the separate switches.

2. The apparatus of claim 1, wherein the pump stage includes both of the pullup FET and the pulldown FET, each concurrently switched by separate switches included in the pump stage and respectively associated with the drain and the source of the respective pullup FET or pulldown FET.

3. The apparatus of claim 1, wherein the pump stage includes a bias switch coupled to a drain node of at least one of the pullup FET or the pulldown FET, the drain node of the at least one of the pullup FET or the pulldown FET being switched by the bias switch to establish a selected bias voltage at the drain node of the at least one of the pullup FET or the pulldown FET when it is in a non-conducting state.

4. The apparatus of claim 1, wherein the pump stage includes a bias switch coupled to a body node of at least one of the pullup FET or the pulldown FET, the body node of the at least one of the pullup FET or the pulldown FET being switched by the bias switch to establish a selected bias voltage at the body node of the at least one of the pullup FET or the pulldown FET when the at least one of the pullup FET or the pulldown FET is in a conducting state to at least reduce a body effect.

5. The apparatus of claim 1, wherein the pump stage includes an inverter circuit configured to monitor a status of the at least one of the pullup FET or the pulldown FET and, when the at least one of the pullup FET or the pulldown FET is in a conducting state, the inverter circuit is configured to provide a signal to a body node of the at least one of the pullup FET or the pulldown FET to establish a bias voltage at the body node to reduce a body effect.

6. The apparatus of claim 1, wherein the charge pump circuit comprises multiple instances of the pump stage, wherein in a first instance of the pump stage, the drain and source of at least one of the pullup FET or the pulldown FET are switched into and held in a non-conducting state by the separate switches associated with the at least one of the pullup FET or the pulldown FET, while, in a second instance of the pump stage, at least one of the pullup FET or the pulldown FET is switched between a conducting and a non-conducting state.

7. The apparatus of claim 1, further comprising a phase-locked loop circuit comprising the charge pump circuit, and further comprising a loop filter coupled to the output node of the pump stage to establish a loop frequency that is based at least in part on a charge output or current output of the pump stage.

8. The apparatus of claim 1, further comprising the pulldown FET and the separate switches respectively associated with the drain and source of the pulldown FET, wherein the separate switches include:
   a first switch coupled between the drain of the pulldown FET and the output node of the pump stage; and
   a second switch coupled between the source of the pulldown FET and a reference node; and
   wherein the first and second switches include respective switch control nodes that are electrically coupled together, wherein the first and second switches switch between conducting and non-conducting states based on the pump stage control signal.

9. The apparatus of claim 8, further comprising a first resistor coupled between the source of the pulldown FET and the second switch.

10. The apparatus of claim 8, wherein the first and second switches are FETs, and wherein both of a width and a length characteristic of the first switch are selected to be smaller than both of a width and a length characteristic of the pulldown FET to minimize an effect of the first switch on an output impedance at the output node of the pump stage.

11. The apparatus of claim 1, further comprising a bias stage that includes:
   a first switch sized and arranged to mirror a first one of the separate switches associated with the at least one of the pullup FET or the pulldown FET; and
   a second switch sized and arranged to mirror a second one of the separate switches associated with the at least one of the pullup FET or the pulldown FET;
   wherein the bias stage is configured to provide a first bias voltage to the gate of the at least one of the pullup FET or the pulldown FET, and wherein the first bias voltage is based on a voltage at the output node of the pump stage.

12. The apparatus of claim 1, further comprising:
   both of the pullup FET and the pulldown FET, each concurrently switched by separate switches respectively associated with the drain and the source of the respective pullup FET or pulldown FET; and
   a bias stage that includes:
      a first switch sized and arranged to mirror the one of the separate switches associated with the drain of the pullup FET; and
      a second switch sized and arranged to mirror the one of the separate switches associated with the drain of the pulldown FET;
      wherein the bias stage is configured to provide a first bias voltage to the gate of the pullup FET and a second bias voltage to a gate of the pulldown FET, and wherein at least one of the first and second bias voltages is based on a voltage at the output node of the pump stage.

13. The apparatus of claim 12, wherein the pump stage includes the respective drain nodes of the pullup FET and the pulldown FET being switched by respective additional separate switches to establish a selected bias voltage at the respective drain nodes when the pullup FET and the pulldown FET are each in a non-conducting state.

14. The apparatus of claim 13, further comprising a unity gain buffer circuit coupled between the output node of the pump stage and the drain nodes of the pullup FET and the pulldown FET via the respective additional separate switches.

15. The apparatus of claim 13, wherein the selected bias voltage is provided by the bias stage and follows a voltage at the output node of the pump stage.

16. A method for providing an oscillating output voltage using a voltage controlled oscillator of a phase-locked loop circuit, the phase-locked loop circuit including a programmable charge pump having a bias stage and an output stage, the method comprising:
    detecting a difference between a reference clock signal and a feedback signal based on the oscillating output voltage;
    generating a digital signal based on the detected difference between the reference clock signal and the feedback signal;
    selecting for use at least one pump stage of the charge pump, the pump stage including a first pullup field-effect transistor (FET) and a first pulldown FET coupled at an output node of the charge pump; and
    in response to the digital signal generated based on the detected difference between the reference clock signal and the feedback signal, selectively decoupling at least one of the first pullup FET and the first pulldown FET from the pump stage using separate switches that are commonly driven by a pump stage control signal and that are respectively associated with a drain and a source of the first pullup FET or the first pulldown FET, wherein the decoupling includes electrically isolating the at least one of the first pullup FET and the first pulldown FET from the output node of the charge pump using the separate switches.

17. The method of claim 16, comprising applying a selected bias voltage, using a switch, at the drain node of at least one of the first pullup FET and the first pulldown FET.

18. The method of claim 16, comprising applying a selected bias voltage at a body node of at least one of the first pullup FET and the first pulldown FET to reduce a body effect.

19. The method of claim 16, comprising selectively decoupling both of the first pullup FET and the first pulldown FET from the leg of the output stage using separate switches that are respectively associated with a drain of the first pullup FET, a source of the first pullup FET, a drain of the first pulldown FET, and a source of the first pulldown FET.

20. A charge pump circuit for use in a phase-locked loop circuit, the charge pump configured to source or sink a signal at an output node, the charge pump comprising:
    a bias stage configured to receive a feedback signal based on the signal at the output node and provide a bias signal based on the received feedback signal; and
    at least a first pump stage configured to at least one of source or sink current to the output node of the charge pump, the first pump stage including:
        a pullup field-effect transistor (FET), including a gate biased by the bias signal, a drain, and a source, wherein the drain and source are concurrently switched by first and second FET switches respectively associated with the drain and source to switch the pullup FET between current conducting and non-conducting states with respect to the output node of the charge pump; and
        a pulldown FET, including a gate biased by the bias signal, a drain, and a source, wherein the drain and source are concurrently switched by third and fourth FET switches respectively associated with the drain and source to switch the pulldown FET between current conducting and non-conducting states with respect to the output node of the charge pump;
    wherein in an ON state for the first pump stage, both of the first and second FET switches switch the pullup FET into a conducting state, or both the third and fourth FET switches switch the pulldown FET into a conducting state.

* * * * *